US006882636B1

(12) United States Patent
Kim et al.

(10) Patent No.: US 6,882,636 B1
(45) Date of Patent: Apr. 19, 2005

(54) APPARATUS AND METHOD FOR ENCODING/DECODING TRANSPORT FORMAT COMBINATION INDICATOR IN CDMA MOBILE COMMUNICATION SYSTEM

(75) Inventors: Jae-Yoel Kim, Kunpo-shi (KR); Hee-Won Kang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 804 days.

(21) Appl. No.: 09/611,069

(22) Filed: Jul. 6, 2000

(30) Foreign Application Priority Data

Jul. 6, 1999 (KR) ........................................... 99-27932

(51) Int. Cl.[7] ............................................... H04B 7/216
(52) U.S. Cl. ....................................... 370/342; 370/335
(58) Field of Search ................................ 370/342, 347, 370/241, 242, 537, 442, 464, 366, 320, 326, 352, 353

(56) References Cited

U.S. PATENT DOCUMENTS

| | | | | | |
|---|---|---|---|---|---|
| 5,550,809 | A | * | 8/1996 | Bottomley et al. | 370/342 |
| 6,208,699 | B1 | * | 3/2001 | Chen et al. | 375/340 |
| 6,341,125 | B1 | * | 1/2002 | Hong et al. | 370/335 |
| 6,408,481 | B1 | * | 6/2002 | Dyson | 15/350 |
| 6,515,987 | B1 | * | 2/2003 | Carrozza et al. | 370/366 |
| 6,542,478 | B1 | * | 4/2003 | Park | 370/308 |
| 6,665,288 | B1 | * | 12/2003 | Ottosson et al. | 370/342 |
| 6,674,712 | B1 | * | 1/2004 | Yang et al. | 370/208 |

FOREIGN PATENT DOCUMENTS

| | | | |
|---|---|---|---|
| EP | 0 565 506 | 4/1993 | |
| EP | 1 104 130 A2 | 5/2001 | |
| KR | 99-75942 | 10/1999 | H03M/7/34 |
| KR | 99-76303 | 10/1999 | H03M/7/34 |

OTHER PUBLICATIONS

European Search Report dated Aug. 12, 2002 issued in counterpart application, namely, EP Appln. No. 00944446.

"UMTS Terrestrial Radio Access Network (UTRAN); UTRA FDD, Multiplexing, Channel Coding and Interleaving Description", *ETSI*, Feb. 1, 1999, pp. 1–16.

A.E. Brouwer and Tom Verhoeff, "An Updated Table of Minimum–Distance Bounds for Binary Linear Codes", IEEE Transactions on Information Theory, vol. 39, No. 2, Mar. 1993.

F.J. MacWilliams and N.J.A. Sloane, "The Theory of Error-Correcting Code", North–Holland.

* cited by examiner

*Primary Examiner*—Kenneth Vanderpuye
*Assistant Examiner*—Ricardo Pizarro
(74) *Attorney, Agent, or Firm*—Dilworth & Barrese LLP

(57) ABSTRACT

An apparatus and method for encoding/decoding a transport format combination indicator (TFCI) in a CDMA mobile communication system. In the TFCI encoding apparatus, a one-bit generator generates a sequence having the same symbols. A basis orthogonal sequence generator generates a plurality of basis orthogonal sequences. A basis mask sequence generator generates a plurality of basis mask sequences. An operation unit receives TFCI bits that are divided into a first information part representing biorthogonal sequence conversion, a second information part representing orthogonal sequence conversion, and a third information part representing mask sequence conversion and combines an orthogonal sequence selected from the basis orthogonal sequence based on the second information, a biorthogonal sequence obtained by combining the selected orthogonal sequence with the same symbols selected based on the first information part, and a mask sequence selected based on the biorthogonal sequence and the third information part, thereby generating a TFCI sequence.

29 Claims, 18 Drawing Sheets

TFCI = $a_{10}a_9a_8a_7a_6a_5a_4a_3a_2a_1$ n = (MAXIMUM INTEGER EQUAL TO OR SMALLER THAN(TFCI)

IF TFCI $< n^2 + n$

THEN WORD1 = n ; WORD2 = TFCI$-n^2$

ELSE WORD1 = TFCI $- n^2$; WORD2 = n

APPARATUS AND METHOD FOR ENCODING/DECODING TRANSPORT FORMAT COMBINATION INDICATOR IN CDMA MOBILE COMMUNICATION SYSTEM

BACKGROUND OF THE INVENTION

1. Field of the Invention

The present invention relates generally to an information transmitting apparatus and method in an IMT 2000 system, and in particular, to an apparatus and method for transmitting a transport format combination indicator (TFCI).

2. Description of the Related Art

A CDMA mobile communication system (hereinafter, referred to as an IMT 2000 system) generally transmits frames that provide a voice service, an image service, a character service on a physical channel such as a dedicated physical data channel (DPDCH) at a fixed or variable data rate. In the case where the data frames which include that sort of services are transmitted at a fixed data rate, there is no need to inform a receiver of the spreading rate of each data frame. On the other hand, if the data frames are transmitted at a variable data rate, which implies that each data frame has a different data rate, a transmitter should inform the receiver of the spreading rate of each data frame determined by its data rate. A data rate is proportional to a data transmission rate and the data transmission rate is inversely proportional to a spreading rate in a general IMT 2000 system.

For transmission of data frames at a variable data rate, a TFCI field of a DPCCH informs a receiver of the data rate of the current service frame. The TFCI field includes a TFCI indicating a lot of information including the data rate of a service frame. The TFCI is information that helps a voice or data service to reliably be provided.

FIGS. 1A to 1D illustrate examples of applications of a TFCI. FIG. 1A illustrates application of the TFCI to an uplink DPDCH and an uplink dedicated physical control channel (DPCCH). FIG. 1B illustrates application of the TFCI to a random access channel (RACH). FIG. 1C illustrates application of the TFCI to a downlink DPDCH and a downlink DPCCH. FIG. 1D illustrates application of the TFCI to a secondary common control physical channel (SCCPCH).

Referring to FIGS. 1A to 1D, one frame is comprised of 16 slots and each slot has a TFCI field. Thus, one frame includes 16 TFCI fields. A TFCI field includes $N_{TFCI}$ bits and a TFCI generally has 32 bits in a frame. To transmit the 32-bit TFCI in one frame, 2 TFCI bits can be assigned to each of the 16 slots ($T_{slot}$=0.625 ms).

FIG. 2 is a block diagram of a base station transmitter in a general IMT 2000 system.

Referring to FIG. 2, multipliers 211, 231, and 232 multiply input signals by gain coefficients $G_1$, $G_3$, and $G_5$. Multipliers 221, 241, and 242 multiply TFCI codewords (TFCI code symbols) received from corresponding TFCI encoders by gain coefficients $G_2$, $G_4$, and $G_6$. The gain coefficients $G_1$ to $G_6$ may have different values according to service types or handover situations. The input signals include pilots and power control signals (TPCs) of a DPCCH and a DPDCH data. A multiplexer 212 inserts 32 bit TFCI code symbols(TFCI codeword) received from the multiplier 221 into the TFCI fields as shown in FIG 1C. A multiplexer 242 inserts 32-bit TFCI code symbols received from the multiplier 241 into the TFCI fields. A multiplexer 252 inserts 32-bit TFCI code symbols received from the multiplier 242 into the TFCI fields. Insertion of TFCI code symbols into TFCI fields is shown in FIGS. 1A to 1D. The 32 code symbols are obtained by encoding TFCI bits (information bits) that define the data rate of a data signal on a corresponding data channel. $1^{st}$, $2^{nd}$, and $3^{rd}$ serial to parallel converters (S/Ps) 213, 233, and 234 separate the outputs of the multiplexers 212, 242, and 252 into I channels and Q channels. Multipliers 214, 222, and 235 to 238 multiply the outputs of the S/Ps 213, 233, and 234 by channelization codes $C_{ch1}$, $C_{ch2}$, and $C_{ch3}$. The channelization codes are orthogonal codes. A first summer 215 sums the outputs of the multipliers 214, 235, and 237 and generates an I channel signal and a second summer 223 sums the outputs of the multipliers 222, 236, and 238 and generates a Q channel signal. A phase shifter 224 shifts the phase of the Q channel signal received from the second summer 223 by 90°. A summer 216 adds the outputs of the first summer 215 and the phase shifter 224 and generates a complex signal I+jQ. A multiplier 217 scrambles the complex signal with a complex PN sequence $C_{scramb}$ assigned to the base station. A signal processor(S/P) 218 separates the scrambled signal into an I channel and a Q channel. Low-pass filters (LPFs) 219 and 225 limits the bandwidths of the I channel and Q channel signals received from the S/P 218 by low-pass-filtering. Multipliers 220 and 226 multiply the outputs of the LPFs 219 and 225 by carriers $\cos(2\pi f_c t)$ and $\sin(2\pi f_c t)$, respectively, thereby transforming the outputs of the LPFs 219 and 225 to an RF (Radio Frequency) band. A summer 227 sums the RFI channel and Q channel signals.

FIG. 3 is a block diagram of a mobile station transmitter in the general IMT 2000 system.

Referring to FIG. 3, multipliers 311, 321, and 323 multiply corresponding signals by channelization codes $C_{ch1}$, $C_{ch2}$, and $C_{ch3}$. Signals 1, 2, 3 are first, second and third DPDCH signal. An input signal 4 includes pilots and TPCs of a DPCCH.TFCI information bits are encoded into 32 bit TFCI code symbols by a TFCI encoder 309. A multiplier 310 inserts a 32 bit TFCI code symbols into the signal 4 as shown in FIG. 1A. A multiplier 325 multiplies a DPCCH signal which include TFCI code symbol received from the multiplier 310 by a channelization code $C_{ch4}$. The channelization codes $C_{ch1}$ to $C_{ch4}$ are orthogonal codes. The 32 TFCI code symbols are obtained by encoding TFCI information bits that define the data rate of the DPDCH signals. Multipliers 312, 322, 324, and 326 multiply the outputs of the multipliers 311, 321, 323, and 325 by gain coefficients $G_1$ to $G_4$, respectably. The gain coefficients $G_1$ to $G_4$ may have different values. A first summer 313 generates an I channel signal by adding the outputs of the multipliers 312 and 322. A second summer 327 generates a Q channel signal by adding the outputs of the multipliers 324 and 326. A phase shifter 328 shifts the phase of the Q channel signal received from the second summer 327 by 90°. A summer 314 adds the outputs of the first summer 313 and the phase shifter 328 and generates a complex signal I+jQ. A multiplier 315 scrambles the complex signal with a PN sequence $C_{scramb}$ assigned to a base station. An S/P 329 divides the scrambled signal into an I channel and a Q channel. LPFs 316 and 330 low-pass-filter the I channel and Q channel signals received from the SIP 329 and generate signals with limited bandwidths. Multipliers 317 and 331 multiply the outputs of the LPFs 316 and 330 by carriers $\cos(2\pi f_c t)$ and $\sin(2\pi f_c t)$, respectively, thereby transforming the outputs of the LPFs 316 and 330 to an RF band. A summer 318 sums the RF I channel and Q channel signals.

TFCIs are categorized into a basic TFCI and an extended TFCI. The basic TFCI represents 1 to 64 different information including the data rates of corresponding data channels using 6 TFCI information bits, whereas the extended TFCI represents 1 to 128, 1 to 256, 1 to 512, or 1 to 1024 different information using 7, 8, 9 or 10 TFCI information bits. The extended TFCI has been suggested to satisfy the requirement of the IMT 2000 system for more various services. TFCI bits are essential for a receiver to receive data frames received from a transmitter. That is the reason why unreliable transmission of the TFCI information bits due to transmission errors lead to wrong interpretation of the frames in the receiver. Therefore, the transmitter encodes the TFCI bits with an error correcting code prior to transmission so that the receiver can correct possibly generated errors in the TFCI.

FIG. 4A conceptionally illustrates a basic TFCI bits encoding structure in a conventional IMT 2000 system and FIG. 4B is an exemplary encoding table applied to a biorthogonal encoder shown in FIG. 4A. As stated above, the basic TFCI has 6 TFCI bits (hereinafter, referred to as basic TFCI bits) that indicate 1 to 64 different information.

Referring to FIGS. 4A and 4B, a biorthogonal encoder 402 receives basic TFCI bits and outputs 32 coded symbols (TFCI codeword or TFCI code symbol). The basic TFCI is basically expressed in 6 bits. Therefore, in the case where a basic TFCI bits of less than 6 bits are applied to the biorthogonal encoder 402, 0s are added to the left end, i.e., MSB (Most Significant Bit) of the basic TFCI bits to increase the number of the basic TFCI bits to 6. The biorthogonal encoder 402 has a predetermined encoding table as shown in FIG. 4B to output 32 coded symbols for the input of the 6 basic TFCI bits. As shown in FIG. 4B, the encoding table lists 32(32-symbol) orthogonal codewords $c_{32.1}$ to $c_{32.32}$ and 32 biorthogonal codewords $\overline{C_{32.1}}$ to $\overline{c_{32.32}}$ that are the complements of the codewords $c_{32.1}$ to $c_{32.32}$. If the LSB (Least Significant Bit) of the basic TFCI is 1, the biorthogonal encoder 402 selects out of the 32 biorthogonal codewords. If the LSB is 0, the biorthogonal encoder 402 selects out of the 32 orthogonal codewords. One of the selected orthogonal codewords or biorthogonal codewords is then selected based on the other TFCI bits.

A TFCI codeword should have powerful error correction capability as stated before. The error correction capability of binary linear codes depends on the minimum distance (dmin) between the binary linear codes. A minimum distance for optimal binary linear codes is described in "An Updated Table of Minimum-Distance Bounds for Binary Linear Codes", A. E. Brouwer and Tom Verhoeff, IEEE Transactions on Information Theory, vol. 39, No. 2, March 1993 (hereinafter, referred to as reference 1).

Reference 1 gives 16 as a minimum distance for binary linear codes by which 32 bits are output for the input of 6 bits. TFCI codewords output from the biorthogonal encoder 402 has a minimum distance of 16, which implies that the TFCI codewords are optimal codes.

FIG. 5A conceptionally illustrates an extended TFCI bits encoding structure in the conventional IMT 2000 system, FIG. 5B is an exemplary algorithm of distributing TFCI bits in a controller shown in FIG. 5A, and FIG. 5C illustrates an exemplary encoding table applied to biorthogonal encoders shown in FIG. 5A. An extended TFCI is also defined by the number of TFCI bits. That is, the extended TFCI includes 7, 8, 9 or 10 TFCI bits (hereinafter, referred to as extended TFCI bits) that represent 1 to 128, 1 to 256, 1 to 512, or 1 to 1024 different information, as stated before.

Referring to FIGS. 5A, 5B, and 5C, a controller 500 divides TFCI bits into two halves. For example, for the input of 10 extended TFCI bits, the controller 500 outputs the first half of the extended TFCI as first TFCI bits (word 1) and the last half as second TFCI bits (word 2). The extended TFCI are basically expressed in 10 bits. Therefore, in the case where an extended TFCI bits of less than 10 bits are input, the controller 500 adds 0s to the MSB of the extended TFCI bits to represent the extended TFCI in 10 bits. Then, the controller 500 divides the 10 extended TFCI bits into word 1 and word 2. Word 1 and word 2 are fed to biorthogonal encoders 502 and 504, respectively. A method of separating the extended TFCI bits $a_1$ to $a_{10}$ into word 1 and word 2 is illustrated in FIG. 5B.

The biorthogonal encoder 502 generates a first TFCI codeword having 16 symbols by encoding word 1 received from the controller 500. The biorthogonal encoder 504 generates a second TFCI codeword having 16 symbols by encoding word 2 received from the controller 500.

The biorthogonal encoders 502 and 504 have predetermined encoding tables to output the 16-symbol TFCI codewords for the two 5-bit TFCI inputs (word 1 and word 2). An exemplary encoding table is illustrated in FIG. 5C. As shown in FIG. 5C, the encoding table lists 16 orthogonal codewords of length 16 bits $c_{16.1}$ to $c_{16.16}$ and biorthogonal codewords $\overline{c_{16.1}}$, to $\overline{c_{16.16}}$ that are the complements of the 16 orthogonal codewords. If the LSB of 5 TFCI bits is 1, a biorthogonal encoder (502 or 504) selects the 16 biorthogonal codewords. If the LSB is 0, the biorthogonal encoder selects the 16 orthogonal codewords. Then, the biorthogonal encoder selects one of the selected orthogonal codewords or biorthogonal codewords based on the other TFCI bits and outputs the selected codeword as the first or second TFCI codeword.

A multiplexer 510 multiplexes the first and second TFCI codewords to a final 32-symbol TFCI codeword.

Upon receipt of the 32-symbol TFCI codeword, a receiver decodes the TFCI codeword separately in halves (word 1 and word 2) and obtains 10 TFCI bits by combining the two decoded 5-bit TFCI halves. In this situation, a possible error even in one of the decoded 5-bit TFCI output during decoding leads to an error over the 10 TFCI bits.

An extended TFCI codeword also should have a powerful error correction capability. To do so, the extended TFCI codeword should have the minimum distance as suggested in reference 1.

In consideration of the number 10 of extended TFCI bits and the number 32 of the symbols of a TFCI codeword, reference 1 gives 12 as a minimum distance for an optimal code. Yet, a TFCI codeword output from the structure shown in FIG. 5A has a minimum distance of 8 because an error in at least one of word 1 and word 2 during decoding results in an error in the whole 10 TFCI bits. That is, although extended TFCI bits are encoded separately in halves, a minimum distance between final TFCI codewords is equal to a minimum distance 8 between codeword outputs of the biorthogonal encoders 502 and 504.

Therefore, a TFCI codeword transmitted from the encoding structure shown in FIG. 5A is not optimal, which may increase an error probability of TFCI bits in the same radio channel environment. With the increase of the TFCI bit error probability, the receiver misjudges the data rate of received data frames and decodes the data frames with an increased error rate, thereby decreasing the efficiency of the IMT 2000 system.

According to the conventional technology, separate hardware structures are required to support the basic TFCI and the extended TFCI. As a result, constraints are imposed on implementation of an IMT 2000 system in terms of cost and system size.

SUMMARY OF THE INVENTION

It is, therefore, an object of the present invention to provide an apparatus and method for encoding an extended TFCI in an IMT 2000 system.

It is also an object of the present invention to provide an apparatus and method for encoding a basic TFCI and an extended TFCI compatibly in an IMT 2000 system.

It is another object of the present invention to provide an apparatus and method for coding an extended TFCI in an IMT 2000 system.

It is still another object of the present invention to provide an apparatus and method for decoding a basic TFCI and an extended TFCI compatibly in an IMT 2000 system.

It is yet another object of the present invention to provide an apparatus and method for generating an optimal code by encoding an extended TFCI in an IMT 2000 system.

It is a further object of the present invention to provide a method of generating mask sequences for use in encoding/decoding an extended TFCI in an IMT 2000 system.

To achieve the above objects, there is provided a TFCI encoding/decoding apparatus and method in a CDMA mobile communication system. In the TFCI encoding apparatus, a one-bit generator generates a sequence having the same symbols. A basis orthogonal sequence generator generates a plurality of basis orthogonal sequences. A basis mask sequence generator generates a plurality of basis mask sequences. An operation unit receives TFCI bits that are divided into a $1^{st}$ information part representing biorthogonal sequence conversion, a $2^{nd}$ information part representing orthogonal sequence conversion, and a $3^{rd}$ information part representing mask sequence conversion and combines an orthogonal sequence selected from the basis orthogonal sequence based on the $2^{nd}$ information, a biorthogonal sequence obtained by combining the selected orthogonal sequence with the same symbols selected based on the $1^{st}$ information part, and a mask sequence selected based on the biorthogonal code sequence and the $3^{rd}$ information part, thereby generating a TFCI sequence.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

Preferred embodiments of the present invention will be described herein below with reference to the accompanying drawings. In the following description, well-known functions or constructions are not described in detail since they would obscure the invention in unnecessary detail.

Figure 1A:
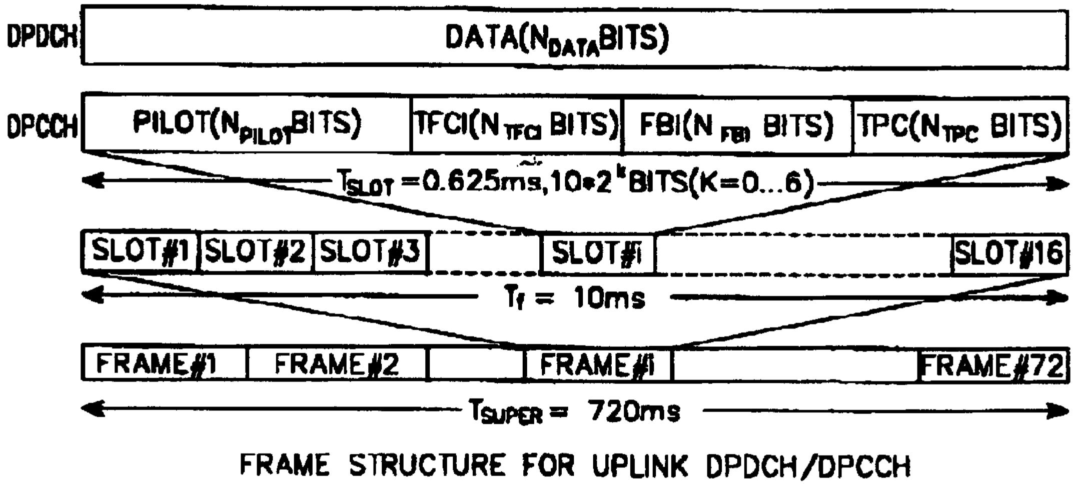
FIGS. 1A to 1D illustrate exemplary applications of a TFCI to channel frames in a genera IMT 2000 system.
Figure 1B:
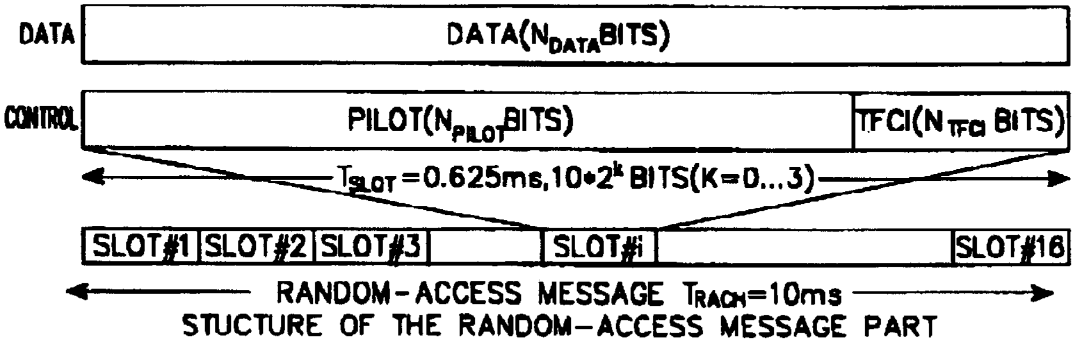
Figure 1C:
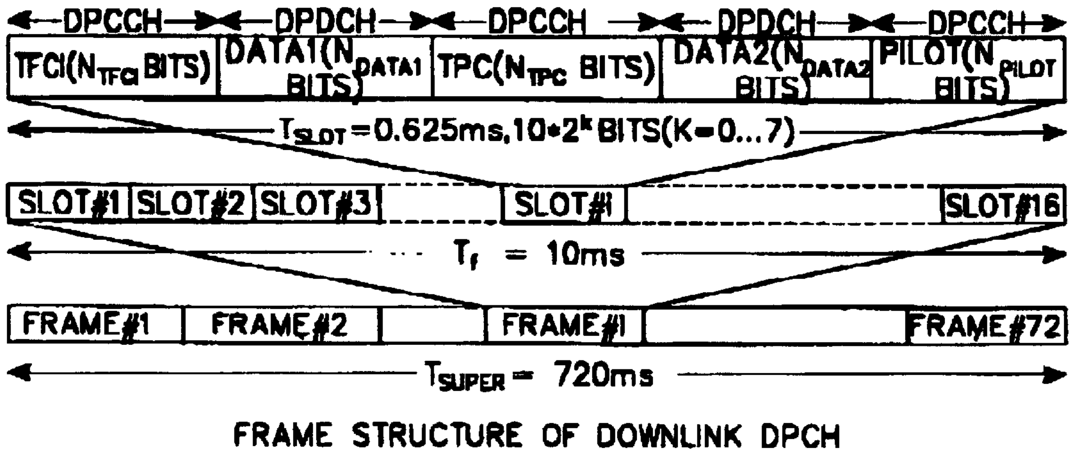
Figure 1D:
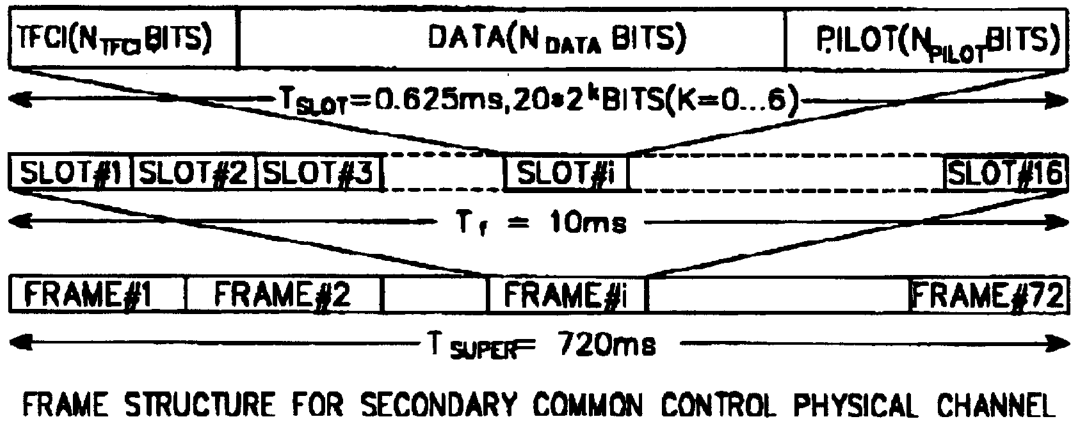
Figure 2:
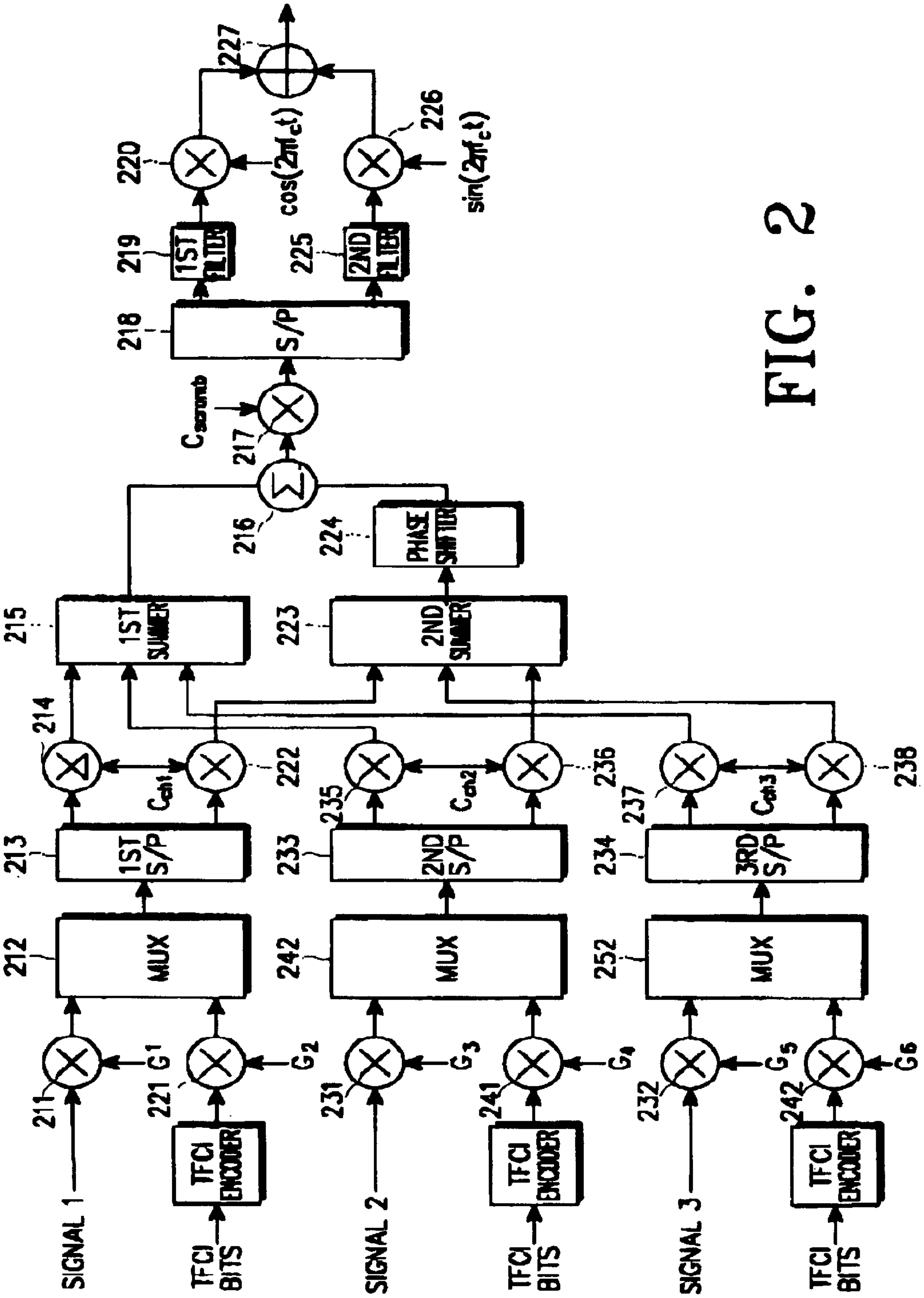
FIG. 2 is a block diagram of a base station transmitter in the general IMT 2000 system.
Figure 3:
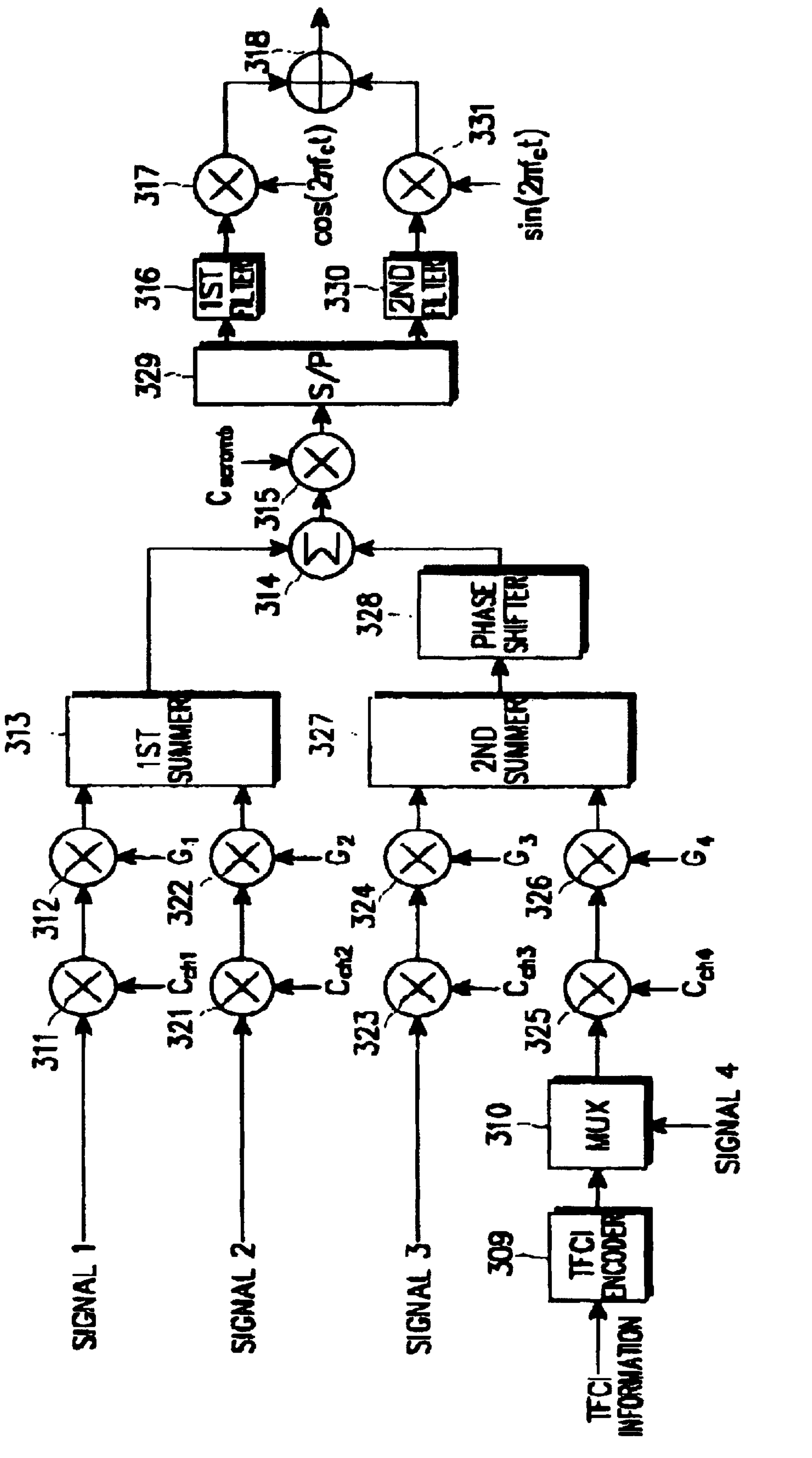
FIG. 3 is a block diagram of a mobile station transmitter in the general IMT 2000 system.
Figure 4A:
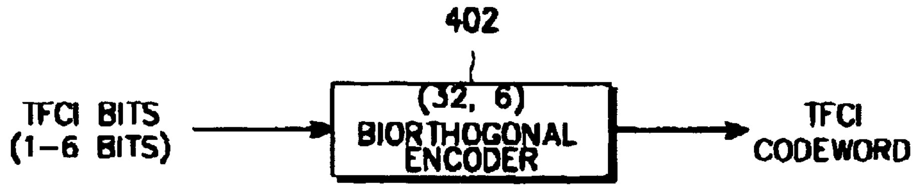
FIG. 4A conceptionally illustrates a basic TFCI encoding structure in a conventional IMT 2000 system.
Figure 4B:
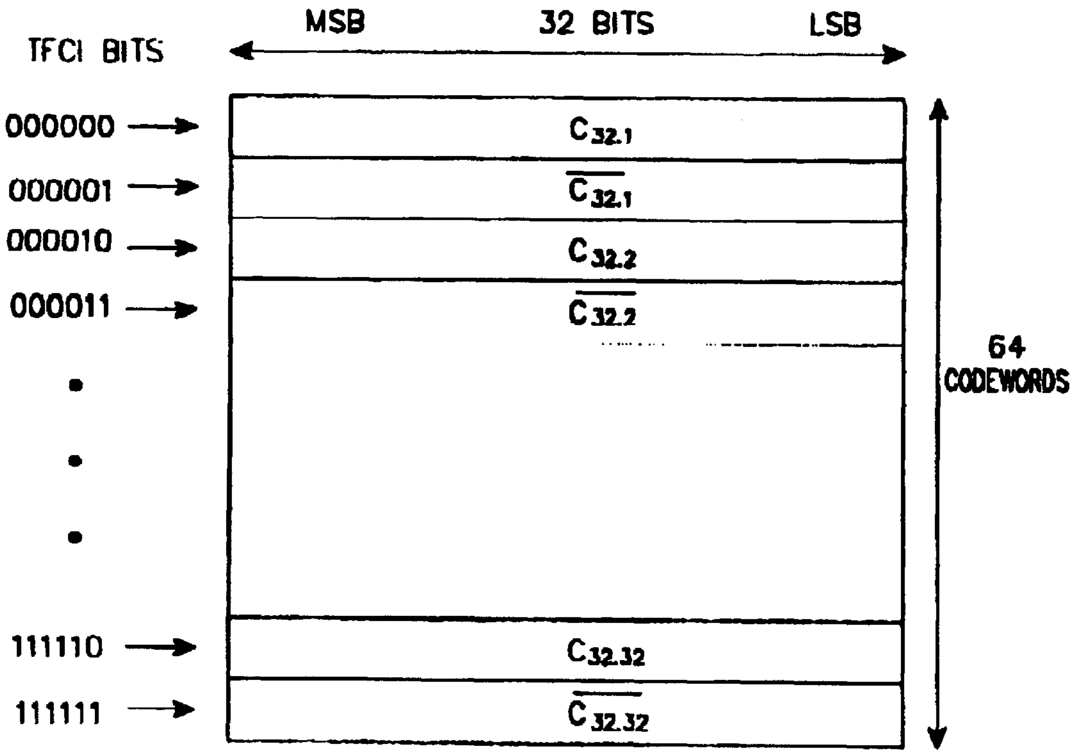
FIG. 4B is an example of an encoding table used in a biorthogonal encoder shown in FIG. 4A.
Figures 5A, 5B:
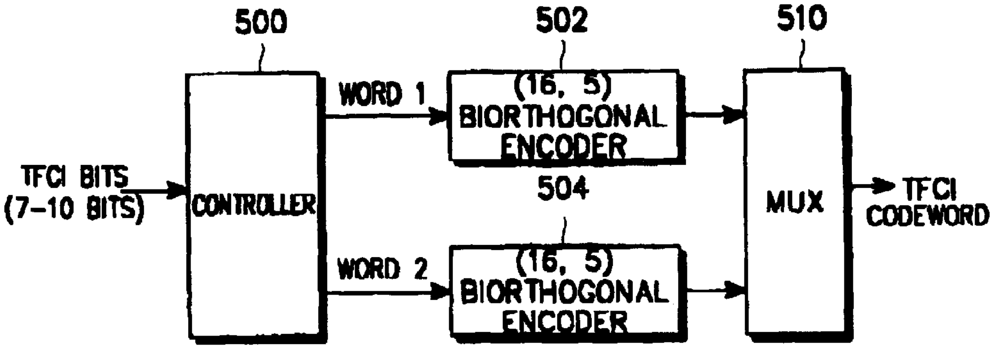
FIG. 5A conceptionally illustrates an extended TFCI encoding structure in the conventional IMT 2000 system.
FIG. 5B is an example of an algorithm of distributing TFCI bits in a controller shown in FIG. 5A.
Figure 5C:
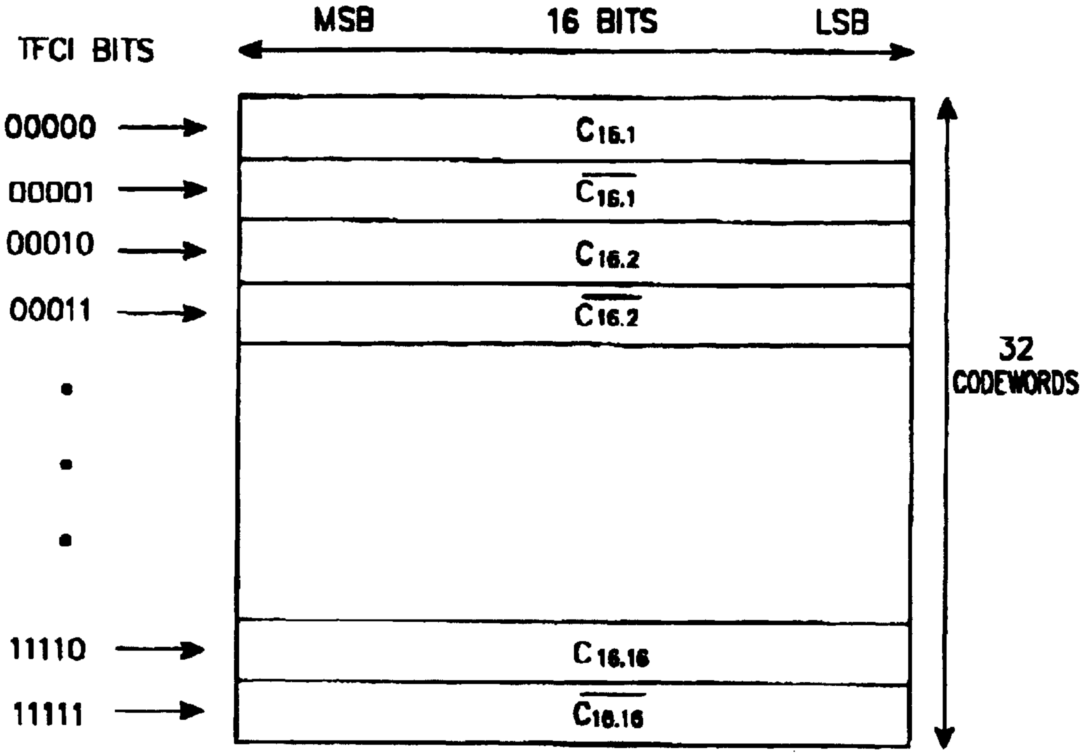
FIG. 5C is an example of an encoding table used in biorthogonal encoders shown in FIG. 5A.
Figure 6:
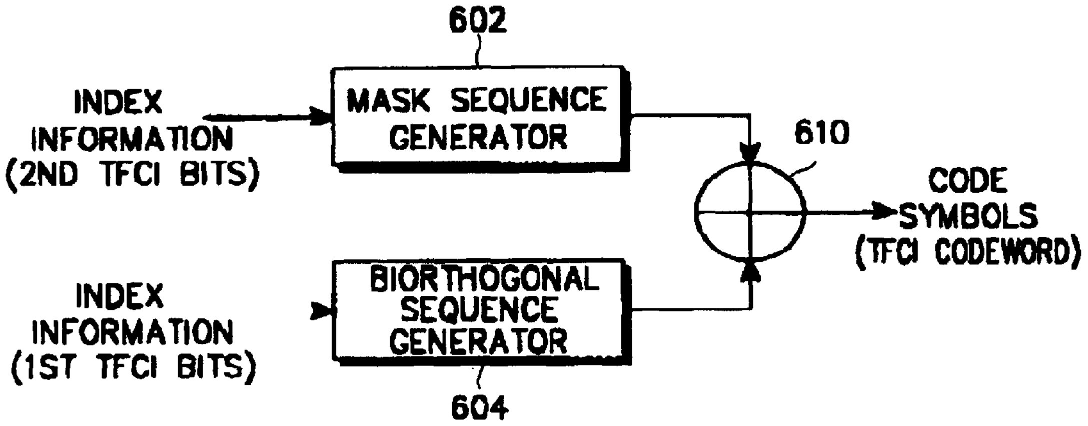
FIG. 6 conceptionally illustrates a TFCI encoding structure in an IMT 2000 system according to the present invention.

The present invention is directed to a TFCI encoding concept of outputting final code symbols (a TFCI codeword) by adding first code symbols (a first TFCI codeword) resulting from first TFCI bits and second code symbols (a second TFCI codeword) resulting from second TFCI bits in an IMT 2000 system. The TFCI encoding concept is shown in FIG. 6. Here, a biorthogonal sequence and a mask sequence are given as the first TFCI codeword and the second TFCI codeword, respectively.

Referring to FIG. 6, TFCI bits are separated into the first TFCI bits and the second TFCI bits. A mask sequence generator 602 generates a predetermined mask sequence by encoding the second TFCI bits and a biorthogonal sequence generator 604 generates a predetermined biorthogonal sequence by encoding the first TFCI bits. An adder 610 adds the mask sequence and the biorthogonal sequence and outputs final code symbols (a TFCI codeword). The mask sequence generator 602 may have an encoding table that lists mask sequences for all possible second TFCI bits. The biorthogonal sequence generator 604 may also have an encoding table that lists biorthogonal sequences for all possible first TFCI bits.

As described above, mask sequences and a mask sequence generating method should be defined to implement the present invention. Walsh codes are given as orthogonal sequences by way of example in embodiments of the present invention.

1. Mask Sequence Generating Method

The present invention pertains to encoding and decoding of TFCI bits and use of an extended Reed Muller code in an IMT 2000 system. For this purpose, predetermined sequences are used and the sequences should have a minimum distance that ensures excellent error correction performance.

A significant parameter that determines the performance or capability of a linear error correcting code is a minimum distance between codewords of the error correcting code. The Hamming weight of a codeword is the number of its symbols other than 0. If a codeword is given as "0111", its Hamming weight is 3. The smallest Hamming weight of a codeword except all "0" codeword is called a minimum weight and the minimum distance of each binary linear code is equal to the minimum weight. A linear error correcting code has a better error correcting performance as its minimum distance is increased. For details, see "The Theory of Error-Correcting Codes", F. J. Macwilliams and N. J. A. Sloane, North-Holland (hereinafter, referred to as reference 2).

An extended Reed Muller code can be derived from a set of sequences each being the sum of the elements of an m-sequence and a predetermined sequence. To use the sequence set as a linear error correcting code, the sequence set should have a large minimum distance. Such sequence sets include a Kasami sequence set, a Gold sequence set, and a Kerdock sequence set. If the total length of a sequence in such a sequence set is $L=2^{2m}$, a minimum distance$=(2^{2m}-2^{m})/2$. For $L=2^{2m+1}$, the minimum distance $(2^{2m+1}-2^{2m})/2$. That is, if L=32, the minimum distance=12.

A description will be made of a method of generating a linear error correcting code with excellent performance, i.e., an extended error correcting code (Walsh codes and mask sequences).

According to a coding theory, there is a column transposition function for making Walsh codes from m-sequences in a group which has been formed by cyclically shifting an originating m-sequence by one to 'n' times, where the 'n' is a length of the m-sequence. In other words, each of the m-sequences is formed by cyclically shifting the originating m-sequence by a particular number of times. The column transposition function is a converting function which converts the sequences in the m-sequence group to Walsh codes. We assume there is a sequence such as a Gold sequence or a Kasami sequence which is formed by adding the originating m-sequence with another originating m-sequence. Another group of m-sequences is similarly formed by cyclically shifting the other originating m-sequence one to 'n' times, where 'n' is the length of the predetermined sequence. Afterwards, a reverse column transposition function is applied to the second group of m-sequences formed from the other originating m-sequence. The application of the reverse column transposition function to the second group of m-sequences creates another set of sequences which shall be defined as mask sequences.

In an embodiment of the present invention, a mask sequence generating method is described in connection with generation of a $(2^n, n+k)$ code (extended Reed Muller code) (here, k=1, . . . , n+1) using a Gold sequence set. The $(2^n, n+k)$ code represents output of a $2^n$-symbol TFCI codeword for the input of (n+k) TFCI bits (input information bits). It is well known that a Gold sequence can be expressed as the sum of two different m-sequences. To generate the $(2^n, n+k)$ code, therefore, Gold sequences of length $(2^n-1)$ should be produced. Here, a Gold sequence is the sum of two m-sequences $m_1(t)$ and $m_2(t)$ that are generated from generator polynomials f1(*x*) and f2(*x*). Given the generator polynomials f1(*x*) and f2(*x*), the m-sequences $m_1(t)$ and $m_2(t)$ are computed using a Trace function.

$$m_1(t)=Tr(A\alpha^t)\ t=0,1,\ldots,30\text{ and}\qquad\text{(Eq. 1)}$$

$$Tr(a)=\sum_{k=0}^{n-1}a^{2^k},\ a\in GF(2^n)$$

where A is determined by the initial value of an m-sequence, α is the root of the polynomial, and n is the order of the polynomial.

Figure 7:
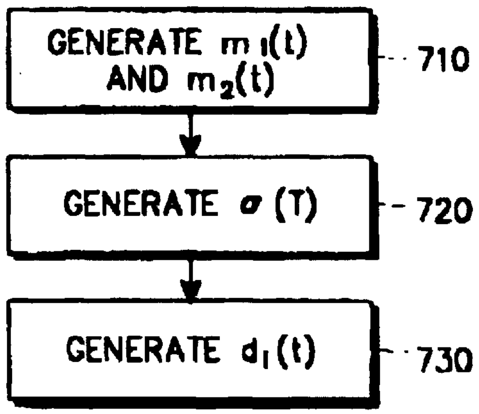
FIG. 7 is a flowchart illustrating an embodiment of a mask sequence generating procedure for TFCI encoding in the IMT 2000 system according to the present invention.

FIG. 7 is a flowchart illustrating a mask sequence generating procedure for use in generating a $(2^n, n+k)$ code from a Gold sequence set.

Referring to FIG. 7, m-sequences $m_1(t)$ and $m_2(t)$ are generated in Eq. 1 using the generator polynomials f1(*x*) and f2(*x*), respectively in step 710. In step 712, a sequence transposition function σ(t) is calculated to make Walsh codes from a sequence set having m-sequences formed by cyclically shifting $m_2(t)$ 0 to n−2 times where all '0' column is inserted in front of the m-sequences made from $m_2(t)$, as shown below:

$$\sigma:\ \{0,1,2,\ldots,2^n-2\}\to\{1,2,3,\ldots,2^n-1\}\qquad\text{(Eq. 2)}$$

$$\sigma(t)=\sum_{t=0}^{n-1}m_2(t+i)2^{n-1-i}\ t=0,1,2,\ldots$$

A set of 31 sequences produced by cyclically shifting the m-sequence $m_1(t)$ 0 to 30 times are column-transposed with the use of $\sigma^{-1}(t)+2$ derived from the reverse function of σ(t) in step 730. Then, 0s are added to the start of each of the resulting column-transposed sequences to make the length of the sequence $2^n$. Thus, a set $d_i(t)$ of $(2^n-1)$ sequences of length $2^n$($i=0, \ldots, 2^n-2$, $t=1, \ldots, 2^n$) are generated.

$$\{d_i(t)|t=1,\ldots,2^n,\ i=0,\ldots,2^n-2\}\qquad\text{(Eq. 3)}$$

$$d_i(t)=\begin{pmatrix}0, & \text{if, }t=1\\ m_1(\sigma^{-1}(t+i)+2), & \text{if, }t=2,3,\ldots,2^n\end{pmatrix}$$

A plurality of $d_i(t)$ are mask functions that can be used as 31 masks.

$d_i(t)$ is characterized in that two different masks among the above masks are added to one of $(2^n-1)$ masks except for the two masks. To further generalize it, each of the $(2^n-1)$ masks can be expressed as the sum of at least two of particular n masks. The n masks are called basis mask sequences. When the $(2^n, n+k)$ code is to be generated, the total number of necessary codewords is $2^{n+k}$ for n+k input information bits (TFCI bits). The number of $2^n$ orthogonal sequences (Walsh sequences) and their complements, i.e. biorthogonal sequences, is $2^n\times2=2^{n+1}$. $2^{k-1}-1(=(2^{n+k}/2^{n+1})-1)$ masks that are not 0s are needed for generation of the $(2^n, n+k)$ code. Here, the $2^{k-1}-1$ masks can be expressed by the use of k−1 basis mask sequences, as stated before.

Now, a description will be given of a method of selecting the k−1 basis mask sequences. The m-sequence $m_1(t)$ is cyclically shifted 0 to $2^{n-1}$ times to generate a set of sequences in step 730 of FIG. 7. Here, an m-sequence obtained by cyclically shifting the m-sequence $m_1(t)$ i times is expressed as $Tr(\alpha^i \cdot \alpha^t)$ according to Eq. 1. That is, a set of sequences are generated by cyclically shifting the m-sequence $m_i(t)$ 0 to 30 times with respect to an initial sequence $A=\{1, \alpha, \ldots, \alpha^{2n-2}\}$. Here, linearly independent k−1 basis elements are found from the Galois elements $1, \alpha, \ldots, \alpha^{2n-2}$ and mask sequences corresponding to the output sequences of a Trace function with the k−1 basis elements as an initial sequence become basis mask sequences. A linear independence condition is expressed as $$\Longleftrightarrow c_1\alpha_1 + c_2\alpha_2 + \ldots + c_{k-1}\alpha_{k-1} \neq 0, \forall\, c_1, c_2, \ldots, c_{k-1} \quad \text{(Eq. 4)}$$

To describe the above generalized mask function generation method in detail, how to generate a (32, 10) code using a Gold sequence set will be described referring to FIG. 7. It is well known that a Gold sequence is expressed as the sum of different predetermined m-sequences. Therefore, a Gold sequence of length 31 should be generated first in order to generate the intended (32, 10) code. The Gold sequence is the sum of two m-sequences generated respectively from polynomials $x^5+x^2+1$ and $x^5+x^4+x+1$. Given a corresponding generator polynomial, each of the m-sequences $m_1(t)$ and $m_2(t)$ is computed using a Trace function by $$m_1(t) = Tr(A\alpha^t)\ t = 0, 1, \ldots, 30 \text{ and} \quad \text{(Eq. 5)}$$

$$Tr(a) = \sum_{n=0}^{4} \alpha^{2^n},\ a \in GF(2^5)$$

where A is determined by the initial value of the m-sequence, a is the root of the polynomial, and n is the order of the polynomial, here 5.

FIG. 7 illustrates the mask function generating procedure to generate the (32, 10) code.

Referring to FIG. 7, m-sequences $m_1(t)$ and $m_2(t)$ are generated in Eq. 1 using the generator polynomials f1($x$) and f2($x$), respectively in step 710. In step 712, the column transposition function $\sigma(t)$ is calculated to make a Walsh code of the m-sequence $m_2(t)$ by $$\sigma:\ \{0, 1, 2, \ldots, 30\} \to \{1, 2, 3, \ldots, 31\} \quad \text{(Eq. 6)}$$

$$\sigma(t) = \sum_{t=0}^{4} m_2(t-i)2^{4-i}$$

Then, a set of 31 sequences produced by cyclically shifting the m-sequence $m_1(t)$ 0 to 30 times are column-transposed with the use of $\sigma^{-1}(t)+2$ derived from the reverse function of $\sigma(t)$ in step 730. Then, 0s are added to the start of each of the resulting sequence-transposed sequences to make the length of the sequence 31. Thus, 31 $d_i(t)$ of length 32 are generated. Here, if i=0, . . . , 31, t=1, . . . , 32. The sequences set generated in step 730 can be expressed as $$\{d_i(t) | t = 1, \ldots, 32, i = 0, \ldots, 30\} \quad \text{(Eq. 7)}$$

$$d_i(t) = \begin{cases} 0, & \text{if, } t = 1 \\ m_1(\sigma^{-1}(t+i)+2), & \text{if, } t = 2, 3, \ldots, 32 \end{cases}$$

A plurality of $d_i(t)$ obtained from Eq. 7 can be used as 31 mask sequences.

$d_i(t)$ is characterized in that two different masks among the above masks are added to one of the 31 masks except for the two masks. In other words, each of the 31 masks can be expressed as a sum of 5 particular masks. These 5 masks are basis mask sequences.

When the (32, 10) code is to be generated, the total number of necessary codewords is $2^n$=1024 for all possible 10 input information bits (TFCI bits). The number of biorthogonal sequences of length 32 is 32×2=64. 15 masks are needed to generate the (32, 10) code. The 15 masks can be expressed as combinations of 4 basis mask sequences.

Now, a description will be given of a method of selecting the 4 basis mask sequences. An m-sequence obtained by cyclically shifting the m-sequence $m_1(t)$ i times is expressed as $Tr(\alpha^i \cdot \alpha^t)$ according to Eq. 1. That is, a set of sequences are generated by cyclically shifting the m-sequence $m_1(t)$ 0 to 30 times with respect to an initial sequence $A=\{1, \alpha, \ldots, \alpha^{2n-2}\}$. Here, 4 linearly independent basis elements are found from the Galois elements $1, \alpha, \ldots, \alpha^{2n-2}$ and mask sequences corresponding to the output sequences of a Trace function with the 4 basis elements as an initial sequence becoming basis mask sequences. A linear independence condition is expressed as $$\alpha, \beta, \gamma, \delta: \text{linearly independent} \quad \text{(Eq. 8)}$$

$$\Longleftrightarrow c_1\alpha_1 + c_2\beta + c_3\gamma, + c_4\delta \neq 0, \forall\, c_1, c_2, c_3, c_4$$

In fact, $1, \alpha, \alpha^2, \alpha^3$ in the Galois $GF(2^5)$ are polynomial sub-bases that are well known as four linearly independent elements. By replacing the variable A in Eq. 1 with the polynomial bases, four basis mask sequences M1, M2, M4, and M8 are achieved.

M1=00101000011000111111000001110111

M2=00000001110011010110110111000111

M4=00001010111110010001101100100101

M8=00011000011001101011110101000

There will herein below be given a description of an apparatus and method for encoding/decoding a TFCI using basis mask sequences as obtained in the above manner in an IMT 2000 system according to embodiments of the present invention.

2. First Embodiment of Encoding/Decoding Apparatus and Method

Figure 8:
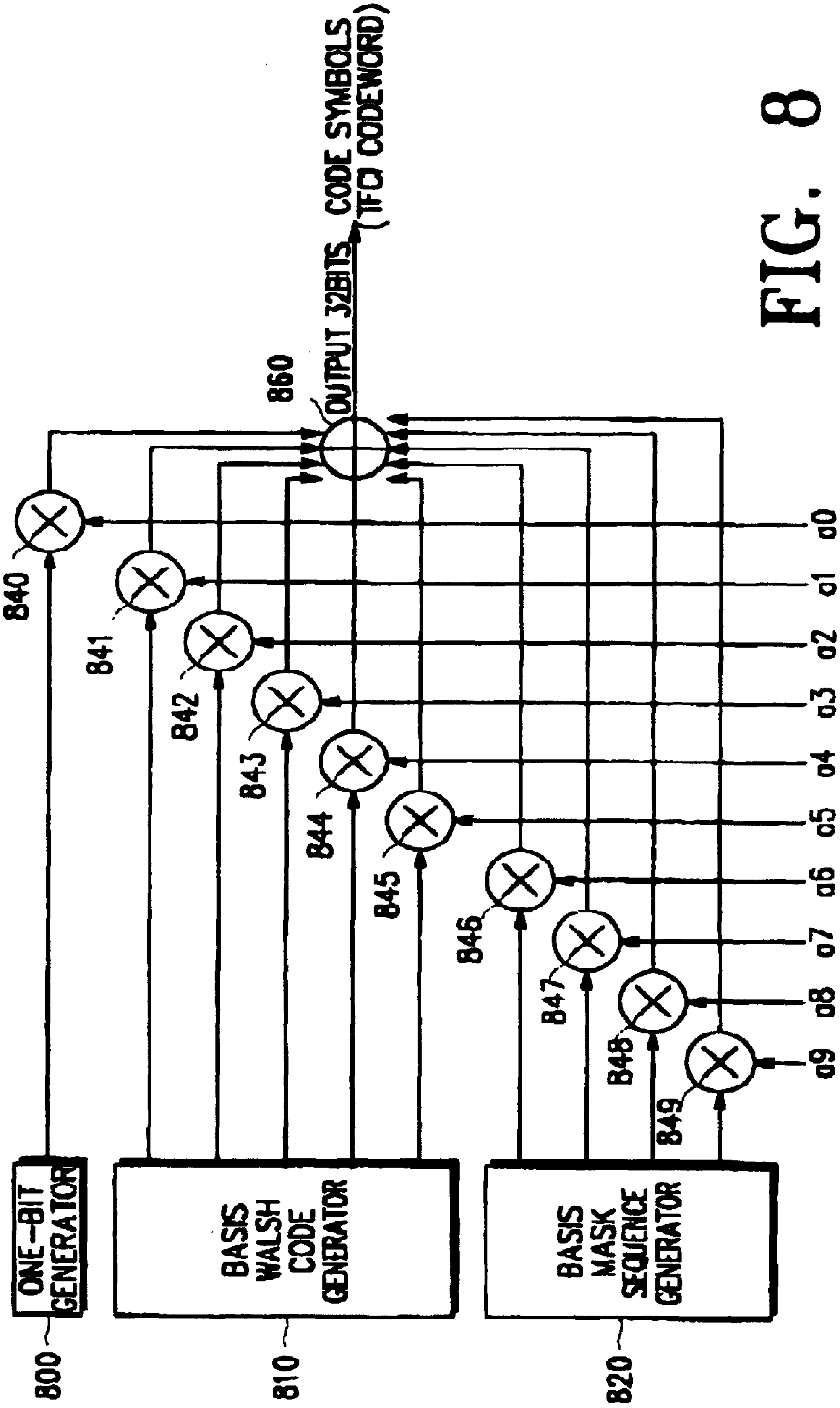
FIG. 8 is a block diagram of an embodiment of a TFCI encoding apparatus in the IMT 2000 system according to the present invention.
Figure 9:
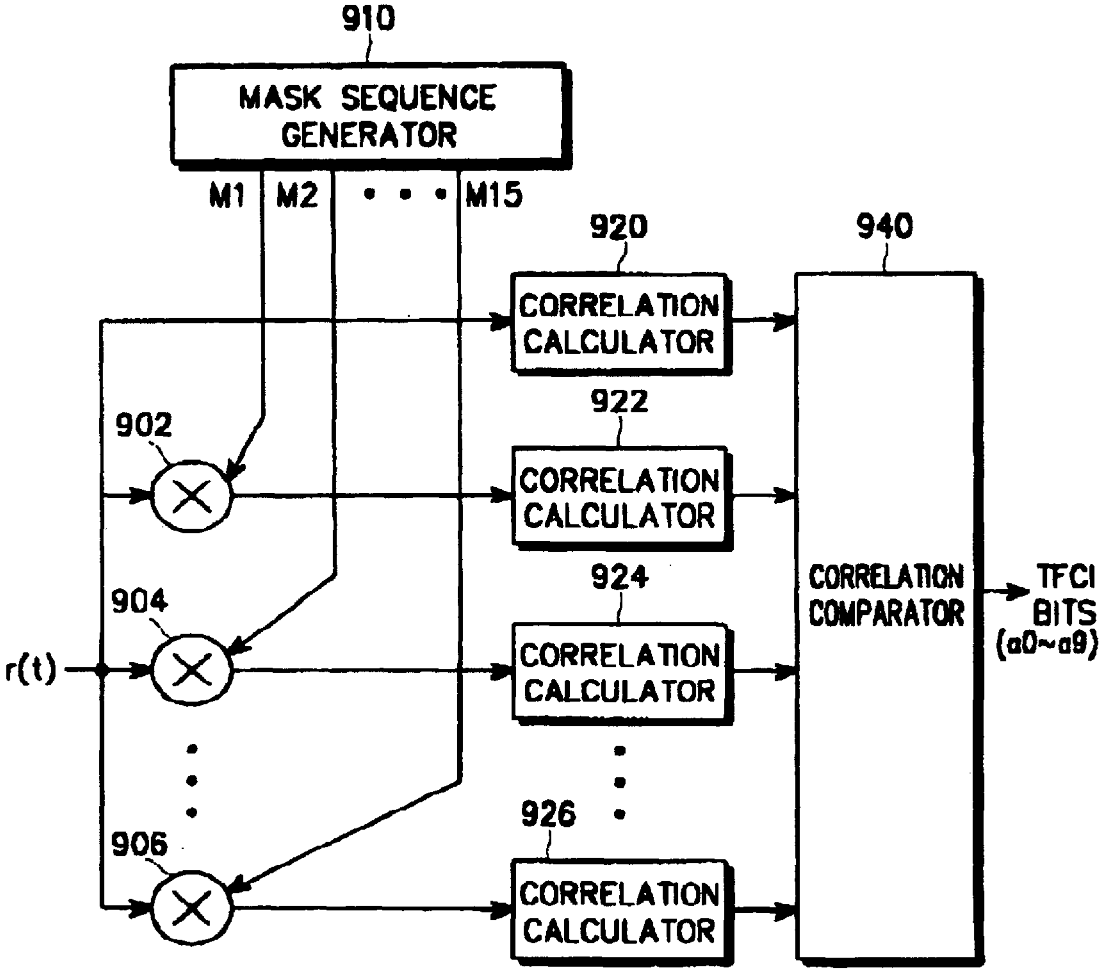
FIG. 9 is a block diagram of an embodiment of a TFCI decoding apparatus in the IMT 2000 system according to the present invention.

FIGS. 8 and 9 are block diagrams of TFCI encoding and decoding apparatuses in an IMT 2000 system according to an embodiment of the present invention.

Referring to FIG. 8, 10 TFCI bits a0 to a9 are applied to corresponding multipliers 840 to 849. A one-bit generator 800 continuously generates a predetermined code bit. That is, since the present invention deals with biorthogonal sequences, necessary bits are generated to make a biorthogonal sequence out of an orthogonal sequence. For example, the one-bit generator 800 generates bits having 1s to inverse an orthogonal sequence (i.e., a Walsh code) generated from a basis Walsh code generator 810 and thus generate a biorthogonal sequence. The basis Walsh code generator 810 generates basis Walsh codes of a predetermined length. The basis Walsh codes refer to Walsh codes from which all intended Walsh codes can be produced through arbitrary addition. For example, when Walsh codes of length 32 are used, the basis Walsh codes are $1^{st}$, $2^{nd}$, $4^{th}$, $8^{th}$, and $16^{th}$ Walsh codes W1, W2, W4, W8, and W16, wherein:

W1: 01010101010101010101010101010101

W2: 00110011001100110011001100110011

W4: 00001111000011110000111100001111

W8: 00000000111111110000000011111111

W16: 00000000000000001111111111111111.

A basis mask sequence generator 820 generates a basis mask sequence of a predetermined length. A basis mask sequence generating method has already been described before and its details will not be described. If a mask sequence of length 32 is used, basis mask sequences are $1^{st}$, $2^{nd}$, $4^{th}$, and $8^{th}$ mask sequences M1, M2, M4, M8, wherein:

M1: 00101000011000111111000001110111

M2: 00000001110011010110110111000111

M4: 00001010111110010001101100101011

M8: 00011100001101110010111101010001.

The multiplier 840 multiplies 1s output from the one-bit generator 800 by the input information bit a0 on a symbol basis.

The multiplier 841 multiplies the basis Walsh code W1 received from the basis Walsh code generator 810 by the input information bit a1. The multiplier 842 multiplies the basis Walsh code W2 received from the basis Walsh code generator 810 by the input information bit a2. The multiplier 843 multiplies the basis Walsh code W4 received from the basis Walsh code generator 810 by the input information bit a3. The multiplier 844 multiplies the basis Walsh code W8 received from the basis Walsh code generator 810 by the input information bit a4. The multiplier 845 multiplies the basis Walsh code W16 received from the basis Walsh code generator 810 by the input information bit a5. The multipliers 841 to 845 multiply the received basis Walsh codes W1, W2, W4, W8, and W16 by their corresponding input information bits symbol by symbol.

Meanwhile, the multiplier 846 multiplies the basis mask sequence M1 by the input information bit a6. The multiplier 847 multiplies the basis mask sequence M2 by the input information bit a7. The multiplier 848 multiplies the basis mask sequence M4 by the input information bit a8. The multiplier 849 multiplies the basis mask sequence M8 by the input information bit a9. The multipliers 846 to 849 multiply the received basis mask sequences M1, M2, M4, and M8 by their corresponding input information bits symbol by symbol.

An adder 860 adds the encoded input information bits received from the multipliers 840 to 849 and outputs final code symbols of length 32 bits (a TFCI codeword). The length of the final code symbols (TFCI codeword) is determined by the lengths of the basis Walsh codes generated from the basis Walsh code generator 810 and the basis mask sequences generated from the basis mask sequence generator 820.

For example, if the input information bits a0 to a9 are "0111011000", the multiplier 840 multiplies 0 as a0 by 1s received from the one-bit generator 800 and generates 32 code symbols being all "0s". The multiplier. 841 multiplies 1 as a1 by W1 received from the basis Walsh code generator 810 and generates code symbols "01010101010101010101010101010101". The multiplier 842 multiplies 1 as a2 by W2 received from the basis Walsh code generator 810 and generates code symbols "00110011001100110011001100110011". The multiplier 843 multiplies 1 as a3 by W4 received from the basis Walsh code generator 810 and generates code symbols "00001111000011110000111100001111". The multiplier 844 multiplies 0 as a4 by W8 received from the basis Walsh code generator 810 and generates 32 code symbols being all "0s". The multiplier 845 multiplies 1 as a5 by W16 received from the basis Walsh code generator 810 and generates "00000000000000001111111111111111". The multiplier 846 multiplies 1 as a6 by M1 received from the basis mask sequence generator 820 and generates "00101000011000111111000001110111". The multiplier 847 multiplies 0 as a7 by M2 received from the basis mask sequence generator 820 and generates 32 code symbols being all 0s. The multiplier 848 multiplies 0 as a8 by M4 received from the basis mask sequence generator 820 and generates 32 code symbols being all 0s. The multiplier 849 multiplies 0 as a9 by M8 received from the basis mask sequence generator 820 and generates 32 code symbols being all 0s. The adder 860 adds the code symbols received from the multipliers 840 to 849 and outputs final code symbols "01000001000010100110011011100001". The final code symbols can be achieved by adding the basis Walsh codes W1, W2, W4 and W16 corresponding to the information bits Is to the basis mask sequence M1 symbol by symbol. In other words, the basis Walsh codes W1, W2, W4 and W16 are summed to W23 and the Walsh code W23 and the basis mask sequence M1 are added to form the TFCI codeword (final code symbols) (=W23+M1) which is outputted from the adder 860.

Figure 11:
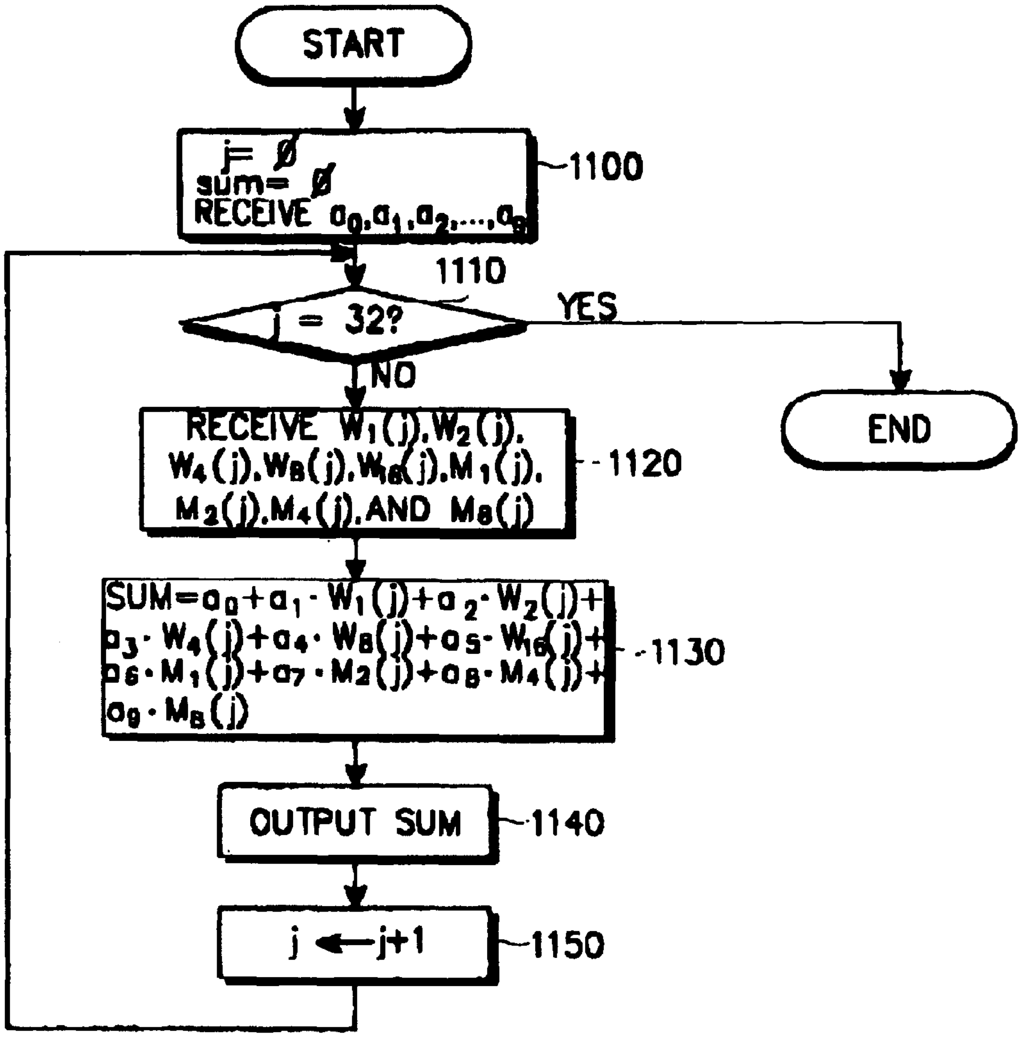
FIG. 11 is a flowchart illustrating an embodiment of a TFCI encoding procedure in the IMT 2000 system according to the present invention.

FIG. 11 is a flowchart illustrating an embodiment of a TFCI encoding procedure in an IMT 2000 system according to the present invention.

Referring to FIG. 11, 10 input information bits (i.e., TFCI bits) are received and variables sum and j are set to an initial value 0 in step 1100. The variable sum indicates final code symbols, and j indicates the count number of final code symbols output after symbol-basis addition. In step 1110, it is determined whether j is 32 in view of the length 32 symbols of Walsh codes and mask sequences used for encoding the input information bits. Step 1110 is performed in order to check whether the input information bits are all encoded with the Walsh codes and the mask sequences symbol by symbol.

If j is not 32 in step 1110, which implies that the input information bits are not encoded completely with respect to all symbols of the Walsh codes, the mask sequences, $j^{th}$ symbols W1(j), W2(j), W4(j), W8(j), and W16(j) of the basis Walsh codes W1, W2, W4, W8, and W16 and $j^{th}$ symbols M1(j), M2(j), M4(j), and M8(j) of the basis mask sequences M1, M2, M4, and M8 are received in step 1120. Then, the received symbols are multiplied by the input information bits on a symbol basis and the symbol products are summed in step 1130. The sum becomes the variable sum.

Step 1130 can be expressed as $$sum=a0+a1\cdot W1(j)+a2\cdot W2(j)+a3\cdot W4(j)+a4\cdot W8(j)+a5\cdot W16(j)+a6\cdot M1(j)+a7\cdot M2(j)+a8\cdot M4(j)+a9\cdot M8(j) \quad \text{(Eq. 9)}$$

As noted from Eq. 9, the input information bits are multiplied by corresponding symbols of the basis Walsh codes and basis mask sequences, symbol products are summed, and the sum becomes an intended code symbol.

In step 1140, sum indicating the achieved $j^{th}$ code symbol, is output. j is increased by 1 in step 1150 and then the procedure returns to step 1110. Meanwhile, if j is 32 in step 1110, the encoding procedure ends.

The encoding apparatus of FIG. 8 according to the embodiment of the present invention can support extended TFCIs as well as basic TFCIs. Encoders for supporting an extended TFCI include a (32, 10) encoder, a (32, 9) encoder, and a (32, 7) encoder.

For the input of 10 input information bits, the (32, 10) encoder outputs a combination of 32 Walsh codes of length 32, 32 bi-orthogonal codes inverted from the Walsh codes, and 15 mask sequences. The 32 Walsh codes can be generated from combinations of 5 basis Walsh Go codes. The 32 bi-orthogonal codes can be obtained by adding 1 to the 32 symbols of each Walsh code. This results has the same effect as multiplication of −1 by the 32 Walsh codes viewed as real numbers. The 15 mask sequences can be achieved through combinations of 5 basis mask sequences. Therefore, a total of 1024 codewords can be produced from the (32, 10) encoder.

The (32, 9) encoder receives 9 input information bits and outputs a combination of 32 Walsh codes of length 32, 32 bi-orthogonal codes inverted from the Walsh codes, and 4 mask sequences. The 4 mask sequences are obtained by combing two of 4 basis mask sequences.

The (32, 7) encoder receives 7 input information bits and outputs a combination of 32 Walsh codes of length among the 1024 codewords, 32 bi-orthogonal codes inverted from the Walsh codes, and one of 4 basis mask sequences.

The above encoders for providing extended TFCIs have a minimum distance 12 and can be implemented by blocking input and output of at least of the 4 basis mask sequences generated from the basis mask sequences 820.

That is, the (32, 9) encoder can be implemented by blocking input and output of one of the four basis mask sequences generated from the basis mask sequence generator 820 shown in FIG. 8. The (32, 8) encoder can be implemented by blocking input and output of two of the basis mask sequences generated from the basis mask sequence generator 820. The (32, 7) encoder can be implemented by blocking input and output of three of the basis mask sequences generated from the basis mask sequence generator 820. As described above, the encoding apparatus according to the embodiment of the present invention can encode flexibly according to the number of input information bits, that is, the number of TFCI bits to be transmitted and maximizes a minimum distance that determined the performance of the encoding apparatus.

Figure 13:
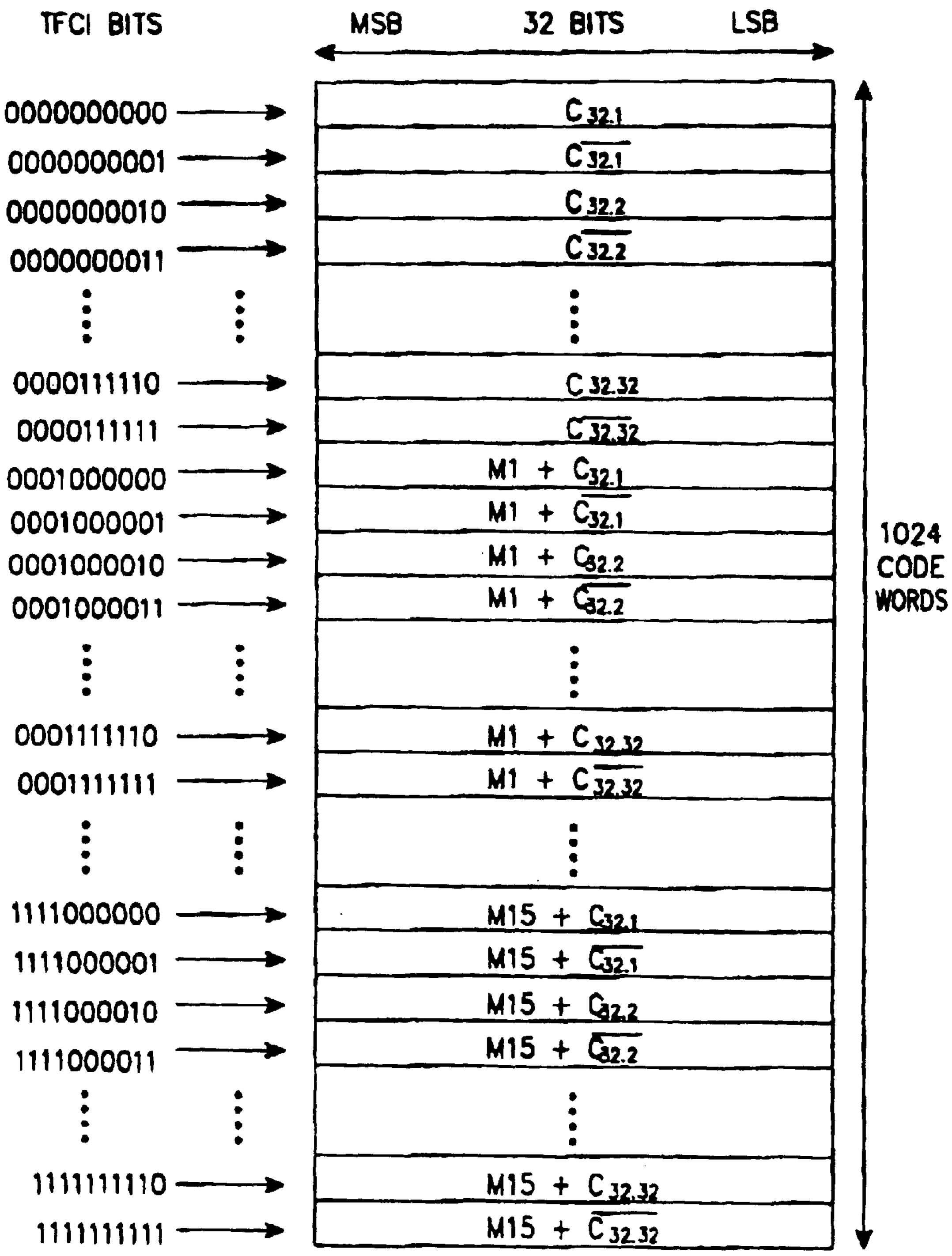
FIG. 13 illustrates an embodiment of the structures of orthogonal sequences and mask sequences determined by a TFCI according to the present invention.

Codewords in the above encoding apparatus are sequences obtained by combining 32 Walsh codes of length 32, 32 bi-orthogonal codes resulting from adding 1s to the Walsh codes, and 15 mask sequences of length 15. The structure of the codewords is shown in FIG. 13.

For better understanding of the TFC bits encoding procedure, Tables 1a to 1f list code symbols (TFCI codewords) versus 10 TFCI bits.

TABLE 1a

| | |
|---|---|
| 0000000000:00000000000000000000000000000000 | 0000000001:11111111111111111111111111111111 |
| 0000000010:01010101010101010101010101010101 | 0000000011:10101010101010101010101010101010 |
| 0000000100:00110011001100110011001100110011 | 0000000101:11001100110011001100110011001100 |
| 0000000110:01100110011001100110011001100110 | 0000000111:10011001100110011001100110011001 |
| 0000001000:00001111000011110000111100001111 | 0000001001:11110000111100001111000011110000 |
| 0000001010:01011010010110100101101001011010 | 0000001011:10100101101001011010010110100101 |
| 0000001100:00111100001111000011110000111100 | 0000001101:11000011110000111100001111000011 |
| 0000001110:01101001011010010110100101101001 | 0000001111:10010110100101101001011010010110 |
| 0000010000:00000000111111110000000011111111 | 0000010001:11111111000000001111111100000000 |
| 0000010010:01010101101010100101010110101010 | 0000010011:10101010010101011010101001010101 |
| 0000010100:00110011110011000011001111001100 | 0000010101:11001100001100111100110000110011 |
| 0000010110:01100110100110010110011010011001 | 0000010111:10011001011001101001100101100110 |
| 0000011000:00001111111100000000111111110000 | 0000011001:11110000000011111111000000001111 |
| 0000011010:01011010101001010101101010100101 | 0000011011:10100101010110101010010101011010 |
| 0000011100:00111100110000110011110011000011 | 0000011101:11000011001111001100001100111100 |
| 0000011110:01101001100101100110100110010110 | 0000011111:10010110011010011001011001101001 |
| 0000100000:00000000000000001111111111111111 | 0000100001:11111111111111110000000000000000 |
| 0000100010:01010101010101011010101010101010 | 0000100011:10101010101010100101010101010101 |
| 0000100100:00110011001100111100110011001100 | 0000100101:11001100110011000011001100110011 |
| 0000100110:01100110011001101001100110011001 | 0000100111:10011001100110010110011001100110 |
| 0000101000:00001111000011111111000011110000 | 0000101001:11110000111100000000111100001111 |
| 0000101010:01011010010110101010010110100101 | 0000101011:10100101101001010101101001011010 |
| 0000101100:00111100001111001100001111000011 | 0000101101:11000011110000110011110000111100 |
| 0000101110:01101001011010011001011010010110 | 0000101111:10010110100101100110100101101001 |
| 0000110000:00000000111111111111111100000000 | 0000110001:11111111000000000000000011111111 |
| 0000110010:01010101101010101010101001010101 | 0000110011:10101010010101010101010110101010 |
| 0000110100:00110011110011001100110000110011 | 0000110101:11001100001100110011001111001100 |
| 0000110110:01100110100110011001100101100110 | 0000110111:10011001011001100110011010011001 |
| 0000111000:00001111111100001111000000001111 | 0000111001:11110000000011110000111111110000 |
| 0000111010:01011010101001011010010101011010 | 0000111011:10100101010110100101101010100101 |
| 0000111100:00111100110000111100001100111100 | 0000111101:11000011001111000011110011000011 |
| 0000111110:01101001100101101001011001101001 | 0000111111:10010110011010010110100110010110 |
| 0001000000:00101000011000111111000001110111 | 0001000001:11010111100111000000111110001000 |
| 0001000010:01111101001101101010010100100010 | 0001000011:10000010110010010101101011011101 |
| 0001000100:00011011010100001100001101000100 | 0001000101:11100100101011110011110010111011 |
| 0001000110:01001110000001011001011000010001 | 0001000111:10110001111110100110100111101110 |
| 0001001000:00100111011011001111111101111000 | 0001001001:11011000100100110000000010000111 |
| 0001001010:01110010001110011010101000101101 | 0001001011:10001101110001100101010111010010 |
| 0001001100:00010100010111111100110001001011 | 0001001101:11101011101000000011001110110100 |
| 0001001110:01000001000010101001100100011110 | 0001001111:10111110111101010110011011100001 |
| 0001010000:00101000100111001111000010001000 | 0001010001:11010111011000110000111101110111 |
| 0001010010:01111101110010011010010111011101 | 0001010011:10000010001101100101101000100010 |
| 0001010100:00011011101011111100001110111011 | 0001010101:11100100010100000011110001000100 |
| 0001010110:01001110111110101001011011101110 | 0001010111:10110001000001010110100100010001 |
| 0001011000:00100111100100111111111110000111 | 0001011001:11011000011011000000000001111000 |
| 0001011010:01110010110001101010101011010010 | 0001011011:10001101001110010101010100101101 |
| 0001011100:00010100101000001100110010110100 | 0001011101:11101011010111110011001101001011 |
| 0001011110:01000000111101011001100111100001 | 0001011111:10111111000010100110011000011110 |
| 0001100000:00101000011000110000111110001000 | 0001100001:11010111100111001111000001110111 |
| 0001100010:01111101001101100101101011011101 | 0001100011:10000010110010011010010100100010 |
| 0001100100:00011011010100000011110010111011 | 0001100101:11100100101011111100001101000100 |
| 0001100110:01001110000001010110100111101110 | 0001100111:10110001111110101001011000010001 |
| 0001101000:00100111011011000000000010000111 | 0001101001:11011000100100111111111101111000 |
| 0001101010:01110010001110010101010111010010 | 0001101011:10001101110001101010101000101101 |
| 0001101100:00010100010111110011001110110100 | 0001101101:11101011101000001100110001001011 |

TABLE 1a-continued

| | |
|---|---|
| 0001101110:01000001000010100110011011100001 | 0001101111:10111110111101011001100100011110 |
| 0001110000:00101000100111000000111101110111 | 0001110001:11010111011000111111000010001000 |
| 0001110010:01111101110010010101101000100010 | 0001110011:10000010001101101010010111011101 |
| 0001110100:00011011101011110011110001000100 | 0001110101:11100100010100001100001110111011 |
| 0001110110:01001110111110100110100100010001 | 0001110111:10110001000001011001011011101110 |
| 0001111000:00100111100100110000000001111000 | 0001111001:11011000011011001111111110000111 |
| 0001111010:01110010110001100101010100101101 | 0001111011:10001101001110011010101011010010 |
| 0001111100:00010100101000000011001101001011 | 0001111101:11101011010111111100110010110100 |
| 0001111110:01000001111101010110011000011110 | 0001111111:10111110000010101001100111100001 |
| 0010000000:00000001110011010110110111000111 | 0010000001:11111110001100101001001000111000 |
| 0010000010:01010100100110000011100010010010 | 0010000011:10101011011001111100011101101101 |
| 0010000100:00110010111111100101111011110100 | 0010000101:11001101000000011010000100001011 |
| 0010000110:01100111101010110000101110100001 | 0010000111:10011000010101001111010001011110 |
| 0010001000:00001110110000100110001011001000 | 0010001001:11110001001111011001110100110111 |
| 0010001010:01011011100101110011011110011101 | 0010001011:10100100011010001100100001100010 |
| 0010001100:00111101111100010101000111111011 | 0010001101:11000010000011101010111000000100 |
| 0010001110:01101000101001000000001001010110 | 0010001111:10010111010110111111101101010001 |
| 0010010000:00000001001100100110110100111000 | 0010010001:11111110110011011001001011000111 |
| 0010010010:01010100011001110011100001101101 | 0010010011:10101011100110001100011110010010 |
| 0010010100:00110010000000010101111000001011 | 0010010101:11001101111111101010000111110100 |
| 0010010110:01100111010101000000101101011110 | 0010010111:10011000101010111111010010100001 |
| 0010011000:00001110001111010110001000110111 | 0010011001:11110001110000101001110111001000 |
| 0010011010:01011011011010000011011101100010 | 0010011011:10100100100101111100100010011101 |
| 0010011100:00111101000011100101000100000100 | 0010011101:11000010111100011010111011111011 |
| 0010011110:01101000010110110000010001010001 | 0010011111:10010111101001001111101110101110 |
| 0010100000:00000001110011011001001000111000 | 0010100001:11111110001100100110110111000111 |
| 0010100010:01010100100110001100011101101101 | 0010100011:10101011011001110011100010010010 |
| 0010100100:00110010111111101010000100001011 | 0010100101:11001101000000010101111011110100 |
| 0010100110:01100111101010111111010001011110 | 0010100111:10011000010101000000101110100001 |
| 0010101000:00001110110000101001110100110111 | 0010101001:11110001001111010110001011001000 |
| 0010101010:01011011100101111100100001100010 | 0010101011:10100100011010000011011110011101 |
| 0010101100:00111101111100011010111000000100 | 0010101101:11000010000011100101000111111011 |
| 0010101110:01101000101001001111101101010001 | 0010101111:10010111010110110000010010101110 |
| 0010110000:00000001001100101001001011000111 | 0010110001:11111110110011010110110100111000 |
| 0010110010:01010100011001111100011110010010 | 0010110011:10101011100110000011100001101101 |
| 0010110100:00110010000000011010000111110100 | 0010110101:11001101111111100101111000001011 |
| 0010110110:01100111010101001111010010100001 | 0010110111:10011000101010110000101101011110 |
| 0010111000:00001110001111011001110111001000 | 0010111001:11110001110000100110001000110111 |
| 0010111010:01011011011010001100100010011101 | 0010111011:10100100100101110011011101100010 |
| 0010111100:00111101000011101010111011111011 | 0010111101:11000010111100010101000100000100 |
| 0010111110:01101000010110111111101110101110 | 0010111111:10010111101001000000010001010001 |
| 0011000000:00101001101011101001110110110000 | 0011000001:11010110010100010110001001001111 |
| 0011000010:01111100111110111100100011100101 | 0011000011:10000011000001000011011100011010 |
| 0011000100:00011010100111011010111010000011 | 0011000101:11100101011000100101000101111100 |
| 0011000110:01001111110010001111011110101110 | 0011000111:10110000001101110000010000101001 |
| 0011001000:00100110101000011001001010111111 | |

TABLE 1b

| | |
|---|---|
| 0011001001:11011001010111100110110101000000 | 0011001010:01110011111101001100011111101010 |
| 0011001011:10001100000010110011100000010101 | 0011001100:00010101100100101010000110001100 |
| 0011001101:11101010011011010101111001110011 | 0011001110:01000000110001111111010011011001 |
| 0011001111:10111111001110000000101100100110 | 0011010000:00101001010100011001110101001111 |
| 0011010001:11010110101011100110001010110000 | 0011010010:01111100000001001100100000011010 |
| 0011010011:10000011111110110011011111100101 | 0011010100:00011010011000101010111001111100 |
| 0011010101:11100101100111010101000110000011 | 0011010110:01001111001101111111101100101001 |
| 0011010111:10110000110010000000010011010110 | 0011011000:00100110010111101001001001000000 |
| 0011011001:11011001101000010110110110111111 | 0011011010:01110011000010111100011100010101 |
| 0011011011:10001100111101000011100011101010 | 0011011100:00010101011011011010000101110011 |
| 0011011101:11101010100100100101111010001100 | 0011011110:01000000001110001111010000100110 |
| 0011011111:10111111110001110000101111011001 | 0011100000:00101001101011100110001001001111 |
| 0011100001:11010110010100011001110110110000 | 0011100010:01111100111110110011011100011010 |
| 0011100011:10000011000001001100100011100101 | 0011100100:00011010100111010101000101111100 |
| 0011100101:11100101011000101010111010000011 | 0011100110:01001111110010000000010000101001 |
| 0011100111:10110000001101111111101111010110 | 0011101000:00100110101000010110110101000000 |
| 0011101001:11011001010111101001001010111111 | 0011101010:01110011111101000011100000010101 |
| 0011101011:10001100000010111100011111101010 | 0011101100:00010101100100100101111001110011 |
| 0011101101:11101010011011011010000110001100 | 0011101110:01000000110001110000101100100110 |
| 0011101111:10111111001110001111010011011001 | 0011110000:00101001010100010110001010110000 |
| 0011110001:11010110101011101001110101001111 | 0011110010:01111100000001000011011111100101 |
| 0011110011:10000011111110111100100000011010 | 0011110100:00011010011000100101000110000011 |
| 0011110101:11100101100111011010111001111100 | 0011110110:01001111001101110000010011010110 |
| 0011110111:10110000110010001111101100101001 | 0011111000:00100110010111100110110110111111 |
| 0011111001:11011001101000011001001001000000 | 0011111010:01110011000010110011100011101010 |
| 0011111011:10001100111101001100011100010101 | 0011111100:00010101011011010101111010001100 |
| 0011111101:11101010100100101010000101110011 | 0011111110:01000000001110000000010111011001 |

TABLE 1b-continued

| | |
|---|---|
| 0011111111:10111111110001111111010000100110 | 0100000000:00001010111110010001101100101011 |
| 0100000001:11110101000001101110010011010100 | 0100000010:01011111010110001001110011111110 |
| 0100000011:10100000010100111011000110000001 | 0100000100:00111001110010100010100000011000 |
| 0100000101:11000110001101011101011111100111 | 0100000110:01101100100111110111110101001101 |
| 0100000111:10010011011000001000001010110010 | 0100001000:00000101111101100001010000100100 |
| 0100001001:11111010000010011110101111011011 | 0100001010:01010000101000110100000101110001 |
| 0100001011:10101111010111001011111010001110 | 0100001100:00110110110001010010011100010111 |
| 0100001101:11001001001110101101100011101000 | 0100001110:01100011100100000111001001000010 |
| 0100001111:10011100011011111000110110111101 | 0100010000:00001010000001100001101111010100 |
| 0100010001:11110101111110011110010000101011 | 0100010010:01011111010100110100111010000001 |
| 0100010011:10100000101011001011000101111110 | 0100010100:00111001001101010010100011100111 |
| 0100010101:11000110110010101101011100011000 | 0100010110:01101100011000000111110110110010 |
| 0100010111:10010011100111111000001001001101 | 0100011000:00000101000010010001010011011011 |
| 0100011001:11111010111101101110101100100100 | 0100011010:01010000010111000100000110001110 |
| 0100011011:10101111101000111011111001110001 | 0100011100:00110110001110100010011111101000 |
| 0100011101:11001001110001011101100000010111 | 0100011110:01100011011011110111001010111101 |
| 0100011111:10011100100100001000110101000010 | 0100100000:00001010111110011110010011010100 |
| 0100100001:11110101000001100001101100101011 | 0100100010:01011111101011001011000110000001 |
| 0100100011:10100000010100110100111001111110 | 0100100100:00111001110010101101011111100111 |
| 0100100101:11000110001101010010100000011000 | 0100100110:01101100100111111000001010110010 |
| 0100100111:10010011011000000111110101001101 | 0100101000:00000101111101101110101111011011 |
| 0100101001:11111010000010010001010000100100 | 0100101010:01010000101000111011111010001110 |
| 0100101011:10101111010111000100000101110001 | 0100101100:00110110110001011101100011101000 |
| 0100101101:11001001001110100010011100010111 | 0100101110:01100011100100001000110110111101 |
| 0100101111:10011100011011110111001001000010 | 0100110000:00001010000001101110010000101011 |
| 0100110001:11110101111110010001101111010100 | 0100110010:01011111010100111011000101111110 |
| 0100110011:10100000101011000100111010000001 | 0100110100:00111001001101011101011100011000 |
| 0100110101:11000110110010100010100011100111 | 0100110110:01101100011000001000001001001101 |
| 0100110111:10010011100111110111110110110010 | 0100111000:00000101000010011110101100100100 |
| 0100111001:11111010111101100001010011011011 | 0100111010:01010000010111001011111001110001 |
| 0100111011:10101111101000110100000110001110 | 0100111100:00110110001110101101100000010111 |
| 0100111101:11001001110001010010011111101000 | 0100111110:01100011011011111000110101000010 |
| 0100111111:10011100100100000111001010111101 | 0101000000:00100010100110101110101101011100 |
| 0101000001:11011101011001010001010010100011 | 0101000010:01110111110011110111110000001001 |
| 0101000011:10001000001100000100000111110110 | 0101000100:00010001101010011101100001101111 |
| 0101000101:11101110010101100010011110010000 | 0101000110:01000100111110010001101001111010 |
| 0101000111:10111011000000110111001011000101 | 0101001000:00101101100101011110010001010011 |
| 0101001001:11010010011010100001101110101100 | 0101001010:01111000110000001011000100000110 |
| 0101001011:10000111001111110100111011111001 | 0101001100:00011110101001101101011101100000 |
| 0101001101:11100001010110010010100010011111 | 0101001110:01001011111100111000001000110101 |
| 0101001111:10110100000011000111110111001010 | 0101010000:00100010011001011110101110100011 |
| 0101010001:11011101100110100001010001011100 | 0101010010:01110111001100001011111011110110 |
| 0101010011:10001000110011110100000100001001 | 0101010100:00010001010101101101100010010000 |
| 0101010101:11101110101010010010011101101111 | 0101010110:01000100000000111000110111000101 |
| 0101010111:10111011111111000111001000111010 | 0101011000:00101101011010101110010010101100 |
| 0101011001:11010010100101010001101101010011 | 0101011010:01111000001111111011000111111001 |
| 0101011011:10000111110000000100111000000110 | 0101011100:00011110010110011101011110011111 |
| 0101011101:11100001101001100010100001100000 | 0101011110:01001011000011001000001011001010 |
| 0101011111:10110100111100110111110100110101 | 0101100000:00100010100110100001010010100011 |
| 0101100001:11011101011001011110101101011100 | 0101100010:01110111110011110100000111110110 |
| 0101100011:10001000001100001011111000001001 | 0101100100:00010001101010010010011110010000 |
| 0101100101:11101110010101101101100001101111 | 0101100110:01000100111111000111001011000101 |
| 0101100111:10111011000000111000110100111010 | 0101101000:00101101100101010001101110101100 |
| 0101101001:11010010011010101110010001010011 | 0101101010:01111000110000000100111011111001 |
| 0101101011:10000111001111111011000100000110 | 0101101100:00011110101001100010100010011111 |
| 0101101101:11100001010110011101011101100000 | 0101101110:01001011111100110111110111001010 |
| 0101101111:10110100000011001000001000110101 | 0101110000:00100010011001010001010001011100 |
| 0101110001:11011101100110101110101110100011 | 0101110010:01110111001100001000001000001001 |
| 0101110011:10001000110011110111110111110110 | 0101110100:00010001010101100010011101101111 |
| 0101110101:11101110101010011101100010010000 | 0101110110:01000100000000110111001000111010 |
| 0101110111:10111011111111001000110111000101 | 0101111000:00101101011010100001101101010011 |
| 0101111001:11010010100101011110010010101100 | 0101111010:01111000001111110100111000000110 |
| 0101111011:10000111110000001011000111111001 | 0101111100:00011110010110010010100001100000 |
| 0101111101:11100001101001101101011110011111 | 0101111110:01001011000011000111110100110101 |
| 0101111111:10110100111100111000001011001010 | 0110000000:00001011001101000111011011101100 |
| 0110000001:11110100110010111000100100010011 | 0110000010:01011110011000010010001110111001 |
| 0110000011:10100001100111101101110001000110 | 0110000100:00111000000000111010001011011111 |
| 0110000101:11000111111110001011101000100000 | 0110000110:01101101010100100001000010001010 |
| 0110000111:10010010101011011110111101110101 | 0110001000:00000100001110110111100111100011 |
| 0110001001:11111011110001001000011000011100 | 0110001010:01010001011011100010110010110110 |
| 0110001011:10101110100100011101001101001001 | 0110001100:00110111000010000100101011010000 |
| 0110001101:11001000111101111011010100101111 | 0110001110:01100010010111010001111110000101 |
| 0110001111:10011101101000101110000001111010 | 0110010000:00001011110010110111011000010011 |
| 0110010001:11110100001101001000100111101100 | |

TABLE 1c

| | |
|---|---|
| 0110010010:01011110100111100010001101000110 | 0110010011:10100001011000011101110010111001 |
| 0110010100:00111000111110000100010100100000 | 0110010101:11000111000001111011101011011111 |
| 0110010110:01101101101011010001000001110101 | 0110010111:10010010010100101110111110001010 |
| 0110011000:00000100110001000111100100011100 | 0110011001:11111011001110111000011011100011 |
| 0110011010:01010001100100010010110001001001 | 0110011011:10101110011011101101001110110110 |
| 0110011100:00110111111101110100101000101111 | 0110011101:11001000000010001011010111010000 |
| 0110011110:01100010101000100001111101111010 | 0110011111:10011101010111011110000010000101 |
| 0110100000:00001011001101001000100100010011 | 0110100001:11110100110010110111011011101100 |
| 0110100010:01011110011000011101110001000110 | 0110100011:10100001100111100010001110111001 |
| 0110100100:00111000000001111011101000100000 | 0110100101:11000111111110000100010111011111 |
| 0110100110:01101101010100101110111101110101 | 0110100111:10010010101011010001000010001010 |
| 0110101000:00000100001110111000011000011100 | 0110101001:11111011110001000111100111100011 |
| 0110101010:01010001011011101101001101001001 | 0110101011:10101110100100010010110010110110 |
| 0110101100:00110111000010001011010100101111 | 0110101101:11001000111101110100101011010000 |
| 0110101110:01100010010111011110000001111010 | 0110101111:10011101101000100001111110000101 |
| 0110110000:00001011110010111000100111101100 | 0110110001:11110100001101000111011000010011 |
| 0110110010:01011110100111101101110010111001 | 0110110011:10100001011000010010001101000110 |
| 0110110100:00111000111110001011101011011111 | 0110110101:11000111000001110100010100100000 |
| 0110110110:01101101101011011110111110001010 | 0110110111:10010010010100100001000001110101 |
| 0110111000:00000100110001001000011011100011 | 0110111001:11111011001110110111100100011100 |
| 0110111010:01010001100100011101001110110110 | 0110111011:10101110011011100010110001001001 |
| 0110111100:00110111111101111011010111010000 | 0110111101:11001000000010000100101000101111 |
| 0110111110:01100010101000101110000010000101 | 0110111111:10011101010111010001111101111010 |
| 0111000000:00100011010101111000011010011011 | 0111000001:11011100101010000111100101100100 |
| 0111000010:01110110000000101101001111001110 | 0111000011:10001001111111010010110000110001 |
| 0111000100:00010000011001001011010110101000 | 0111000101:11101111100110110100101001010111 |
| 0111000110:01000101001100011110000011111101 | 0111000111:10111010110011100001111100000010 |
| 0111001000:00101100010110001000100110010100 | 0111001001:11010011101001110111011001101011 |
| 0111001010:01111001000011011101110011000001 | 0111001011:10000110111100100010001100111110 |
| 0111001100:00011111011010111011101010100111 | 0111001101:11100000100101000100010101011000 |
| 0111001110:01001010001111101110111111110010 | 0111001111:10110101110000010001000000001101 |
| 0111010000:00100011101010001000011001100100 | 0111010001:11011100010101110111100110011011 |
| 0111010010:01110110111111011101001100110001 | 0111010011:10001001000000100010110011001110 |
| 0111010100:00010000100110111011010101010111 | 0111010101:11101111011001000100101010101000 |
| 0111010110:01000101110011101110000000000010 | 0111010111:10111010001100010001111111111101 |
| 0111011000:00101100101001111000100101101011 | 0111011001:11010011010110000111011010010100 |
| 0111011010:01111001111100101101110000111110 | 0111011011:10000110000011010010001111000001 |
| 0111011100:00011111100101001011101001011000 | 0111011101:11100000011010110100010110100111 |
| 0111011110:01001010110000011110111100001101 | 0111011111:10110101001111100001000011110010 |
| 0111100000:00100011010101110111100101100100 | 0111100001:11011100101010001000011010011011 |
| 0111100010:01110110000000100010110000110001 | 0111100011:10001001111111011101001111001110 |
| 0111100100:00010000011001000100101001010111 | 0111100101:11101111100110111011010110101000 |
| 0111100110:01000101001100010001111100000010 | 0111100111:10111010110011101110000011111101 |
| 0111101000:00101100010110000111011001101011 | 0111101001:11010011101001111000100110010100 |
| 0111101010:01111001000011010010001100111110 | 0111101011:10000110111100101101110011000001 |
| 0111101100:00011111011010110100010101011000 | 0111101101:11100000100101001011101010100111 |
| 0111101110:01001010001111100001000000001101 | 0111101111:10110101110000011110111111110010 |
| 0111110000:00100011101010000111100110011011 | 0111110001:11011100010101111000011001100100 |
| 0111110010:01110110111111010010110011001110 | 0111110011:10001001000000101101001100110001 |
| 0111110100:00010000100110110100101010101000 | 0111110101:11101111011001001011010101010111 |
| 0111110110:01000101110011100001111111111101 | 0111110111:10111010001100011110000000000010 |
| 0111111000:00101100101001110111011010010100 | 0111111001:11010011010110001000100101101011 |
| 0111111010:01111001111100100010001111000001 | 0111111011:10000110000011011101110000111110 |
| 0111111100:00011111100101000100010110100111 | 0111111101:11100000011010111011101001011000 |
| 0111111110:01001010110000010001000011110010 | 0111111111:10110101001111101110111100001101 |
| 1000000000:00011100001101110010111101010001 | 1000000001:11100011110010001101000010101110 |
| 1000000010:01001001011000100111101000000100 | 1000000011:10110110100111011000010111111011 |
| 1000000100:00101111000001000001110001100010 | 1000000101:11010000111110111110001110011101 |
| 1000000110:01111010010100010100100100110111 | 1000000111:10000101101011101011011011001000 |
| 1000001000:00010011001110000010000001011110 | 1000001001:11101100110001111101111110100001 |
| 1000001010:01000110011011010111010100001011 | 1000001011:10111001100100101000101011110100 |
| 1000001100:00100000000010110001001101101101 | 1000001101:11011111111101001110110010010010 |
| 1000001110:01110101010111100100011000111000 | 1000001111:10001010101000011011100111000111 |
| 1000010000:00011100110010000010111110101110 | 1000010001:11100011001101111101000001010001 |
| 1000010010:01001001100111010111101011111011 | 1000010011:10110110011000101000010100000100 |
| 1000010100:00101111111101100011100100111101 | 1000010101:11010000000010011100011011000010 |
| 1000010110:01111010101011100100100111001000 | 1000010111:10000101010100011011011000110111 |
| 1000011000:00010011110001110010000010100001 | 1000011001:11101100001110001101111101011110 |
| 1000011010:01000110100100100111010111110100 | 1000011011:10111001011011011000101000001011 |
| 1000011100:00100000111101000001001110010010 | 1000011101:11011111000010111110110001101101 |
| 1000011110:01110101101000010100011011000111 | 1000011111:10001010010111101011100100111000 |
| 1000100000:00011100001101111101000010101110 | 1000100001:11100011110010000010111101010001 |
| 1000100010:01001001011000101000010111111011 | 1000100011:10110110100111010111101000000100 |
| 1000100100:00101111000001001110001110011101 | 1000100101:11010000111110110001110001100010 |
| 1000100110:01111010010100011011011011001000 | 1000100111:10000101101011100100100100110111 |
| 1000101000:00010011001110001101111110100001 | 1000101001:11101100110001110010000001011110 |
| 1000101010:01000110011011011000101011110100 | 1000101011:10111001100100100111010100001011 |
| 1000101100:00100000000010111110110010010010 | 1000101101:11011111111101000001001101101101 |
| 1000101110:01110101010111101011100111000111 | 1000101111:10001010101000010100011000111000 |

TABLE 1c-continued

| | |
|---|---|
| 1000110000:00011100110010001101000001010001 | 1000110001:11100011001101110010111110101110 |
| 1000110010:01001001100111011000010100000100 | 1000110011:10110110011000100111101011111011 |
| 1000110100:00101111111110111110001101100010 | 1000110101:11010000000001000001110010011101 |
| 1000110110:01111010101011101011011000110111 | 1000110111:10000101010100010100100111001000 |
| 1000111000:00010011110001111101111101011110 | 1000111001:11101100001110000010000010100001 |
| 1000111010:01000110100100101000101000001011 | 1000111011:10111001011011010111010111110100 |
| 1000111100:00100000111101001110110001101101 | 1000111101:11011111000010110001001110010010 |
| 1000111110:01110101101000011011100100111000 | 1000111111:10001010010111100100011011000111 |
| 1001000000:00110100010101001101111100100110 | 1001000001:11001011101010110010000011011001 |
| 1001000010:01100001000000011000101001110011 | 1001000011:10011110111111100111010110001100 |
| 1001000100:00000111011001111110110000010101 | 1001000101:11111000100110000001001111101010 |
| 1001000110:01010010001100101011100101000000 | 1001000111:10101101110011010100011010111111 |
| 1001001000:00111011010110111101000000101001 | 1001001001:11000100101001000010111111010110 |
| 1001001010:01101110000011101000010101111100 | 1001001011:10010001111100010111101010000011 |
| 1001001100:00001000011010001110001100011010 | 1001001101:11110111100101110001110011100101 |
| 1001001110:01011101001111011011011001001111 | 1001001111:10100010110000100100100110110000 |
| 1001010000:00110100101010111101111111011001 | 1001010001:11001011010101000010000000100110 |
| 1001010010:01100001111111101000101010001100 | 1001010011:100111100000000010111010101110011 |
| 1001010100:00000111100110001110110011101010 | 1001010101:11111000011001110001001100010101 |
| 1001010110:01010010110011011011100110111111 | 1001010111:10101101001100100100011001000000 |
| 1001011000:00111011101001001101000011010110 | 1001011001:11000100010110110010111100101001 |
| 1001011010:01101110111100011000010110000011 | |

TABLE 1d

| | |
|---|---|
| 1001011011:10010001000011100111101001111100 | 1001011100:00001000100101111110001111100101 |
| 1001011101:11110111011010000001110000011010 | 1001011110:01011101110000101011011010110000 |
| 1001011111:10100010001111010100100101001111 | 1001100000:01101000101010000100000011011001 |
| 1001100001:11001011101010111101111100100110 | 1001100010:1100001000000010111010110001100 |
| 1001100011:10011110111111101000101001110011 | 1001100100:00000111011001110001001111101010 |
| 1001100101:1111000100110001110110000010101 | 1001100110:01010010001100100100011010111111 |
| 1001100111:10101101110011011011100101000000 | 1001101000:00111011010110110010111111010110 |
| 1001101001:10001001010010011010000000101001 | 1001101010:01101110000011100111101010000011 |
| 1001101011:10010001111100011000010101111100 | 1001101100:00010000110100000001110011100101 |
| 1001101101:11110111100101111110001100011010 | 1001101110:01011101001111010100100110110000 |
| 1001101111:10100010110000101011011001001111 | 1001110000:01101001010101100100000000100110 |
| 1001110001:11001011010101001101111111011001 | 1001110010:01100001111111100111010101110011 |
| 1001110011:10011110000000011000101010001100 | 1001110100:0000111100110000001001100010101 |
| 1001110101:11111000011001111110110011101010 | 1001110110:1010010110011010100011001000000 |
| 1001110111:10101101001100101011100110111111 | 1001111000:00111011101001000010111100101001 |
| 1001111001:11000100010110111101000011010110 | 1001111010:01101110111100010111101001111100 |
| 1001111011:00100010000111010000101100000011 | 1001111100:00001000100101110001110000011010 |
| 1001111101:11110111011010001110001111100101 | 1001111110:01011101110000100100100101001111 |
| 1001111111:10100010001111011011011010110000 | 1010000000:00011101111110100100001010010110 |
| 1010000001:1100010000001011011110101101001 | 1010000010:0100100010101110001011111000011 |
| 1010000011:0110111010100001110100000111100 | 1010000100:0101110110010010111000110100101 |
| 1010000101:1010001001101101000111001011010 | 1010000110:01111011100111000010010011110000 |
| 1010000111:10000100011000111101101100001111 | 1010001000:0010010111101010100110110011001 |
| 1010001001:1101101000010101011001001100110 | 1010001010:1000111101000000001100011001100 |
| 1010001011:10111000010111111110011100110011 | 1010001100:00100001110001100111111010101010 |
| 1010001101:10111100011100110000000101010101 | 1010001110:01110100100100110010101111111111 |
| 1010001111:0001011011011001101010000000000 | 1010010000:0011101000001010100001001101001 |
| 1010010001:11100010111110101011110110010110 | 1010010010:1001000010100000001011100111100 |
| 1010010011:10110111101011111110100011000011 | 1010010100:0101110001101100111000101011010 |
| 1010010101:1010001110010011000111010100101 | 1010010110:01111011011000110010010000001111 |
| 1010010111:10000100100111001101101111110000 | 1010011000:0010010000010100100110101100110 |
| 1010011001:11101101111101011011001010011001 | 1010011010:01000111010111110001100000110011 |
| 1010011011:10111000101000001110011111001100 | 1010011100:001000001001110010111111001010101 |
| 1010011101:1011110110001101000000110101010 | 1010011110:01110100011011000010101100000000 |
| 1010011111:10001011100100111101010011111111 | 1010100000:00011101111110101011110101101001 |
| 1010100001:1100010000001010100001010010110 | 1010100010:01001000101011111110100000111100 |
| 1010100011:0110111010100000001011111000011 | 1010100100:0101110110010011000111001011010 |
| 1010100101:1010001001101100111000110100101 | 1010100110:01111011100111001101101100001111 |
| 1010100111:0000100011000110010010011110000 | 1010101000:0010010111101011011001001100110 |
| 1010101001:1101101000010100100110110011001 | 1010101010:01000111101000001110011100110011 |
| 1010101011:0111000010111110001100011001100 | 1010101100:0100001110001101000000101010101 |
| 1010101101:11011110001110010111111010101010 | 1010101110:1110100100100111101010000000000 |
| 1010101111:10001011011011000010101111111111 | 1010110000:00011101000001011011110110010110 |
| 1010110001:1100010111110100100001001101001 | 1010110010:1001000010100001110100011000011 |
| 1010110011:10110111101011110001011100111100 | 1010110100:0101110001101101000111010100101 |
| 1010110101:1010001110010010111000101011010 | 1010110110:01111011011000111101101111110000 |
| 1010110111:0000100100111000010010000001111 | 1010111000:0010010000010101011001010011001 |
| 1010111001:11101101111101010100110101100110 | 1010111010:01000111010111111110011111001100 |
| 1010111011:01110001010000000001100000110011 | 1010111100:0100001001110011000000110101010 |
| 1010111101:11011110110001100111111001010101 | 1010111110:01110100011011001101010011111111 |
| 1010111111:0001011100100110010101100000000 | 1011000000:00110101100110011011001011100001 |

TABLE 1d-continued

| | |
|---|---|
| 1011000001:10010100110011001001101000111110 | 1011000010:01100000110011001110011110110100 |
| 1011000011:0011111001100110001100001001011 | 1011000100:0000110101010101000000111010010 |
| 1011000101:11111001010101010111111000101101 | 1011000110:01010011111111111101010010000111 |
| 1011000111:01011000000000000010101101111000 | 1011001000:00111010100101101011110111101110 |
| 1011001001:10001010110100101000010000010001 | 1011001010:01101111110000111110100010111011 |
| 1011001011:0010000001111000001011101000100 | 1011001100:00001001101001011000111011011101 |
| 1011001101:1110110010110100111000100100010 | 1011001110:01011100111100001101101110001000 |
| 1011001111:10100011000011110010010001110111 | 1011010000:00110101011001101011001000011110 |
| 1011010001:1001010100110010100110111100001 | 1011010010:01100000001100111110011101001011 |
| 1011010011:10011111110011000001100010110100 | 1011010100:0000110010101011000000100101101 |
| 1011010101:11111001101010100111111011010010 | 1011010110:10100110000000001101010001111000 |
| 1011010111:10101100111111110010101110000111 | 1011011000:00111010011010011011110100010001 |
| 1011011001:1000101100101100100001011101110 | 1011011010:01101111001111001110100001000100 |
| 1011011011:10010000110000110001011110111011 | 1011011100:0001001010110101000111000100010 |
| 1011011101:11110110101001010111000111011101 | 1011011110:01011100000011111101101101110111 |
| 1011011111:10100011111100000010010010001000 | 1011100000:00110101100110010100110100011110 |
| 1011100001:11001010011001101011001011100001 | 1011100010:01100000110011000001100001001011 |
| 1011100011:10011111001100111110011110110100 | 1011100100:00000110101010100111111000101101 |
| 1011100101:11111001010101011000000111010010 | 1011100110:01010011111111110010101101111000 |
| 1011100111:10101100000000001101010010000111 | 1011101000:00111010100101100100001000010001 |
| 1011101001:11000101011010011011110111101110 | 1011101010:01101111110000110001011101000100 |
| 1011101011:10010000001111001110100010111011 | 1011101100:00001001101001010111000100100010 |
| 1011101101:11110110010110101000111011011101 | 1011101110:01011100111100000010010001110111 |
| 1011101111:10100011000011111101101110001000 | 1011110000:00110101011001100100110111100001 |
| 1011110001:11001010100110011011001000011110 | 1011110010:01100000001100110001100010110100 |
| 1011110011:10011111110011001110011101001011 | 1011110100:00000110010101010111111011010010 |
| 1011110101:11111001101010101000000100101101 | 1011110110:01010011000000000010101110000111 |
| 1011110111:10101100111111111101010001111000 | 1011111000:00111010011010010100001011101110 |
| 1011111001:11000101100101101011110100010001 | 1011111010:01101111001111000001011110111011 |
| 1011111011:10010000110000111110100001000100 | 1011111100:00001001010110100111000111011101 |
| 1011111101:11110110101001011000111000100010 | 1011111110:01011100000011110010010010001000 |
| 1011111111:10100011111100001101101101110111 | 1100000000:00010110110011100011010001111010 |
| 1100000001:11101001001100011100101110000101 | 1100000010:01000011100110110110000100101111 |
| 1100000011:10111100011001001001111011010000 | 1100000100:00100101111111010000011101001001 |
| 1100000101:11011010000000101111100010110110 | 1100000110:01110000101010000101001000011100 |
| 1100000111:10001111010101111010110111100011 | 1100001000:00011001110000010011101101110101 |
| 1100001001:1110011000111101100010010001010 | 1100001010:01001100100101000110111000100000 |
| 1100001011:10110011011010111001000111011111 | 1100001100:00101010111100100000100001000110 |
| 1100001101:11010101000011011111011110111001 | 1100001110:01111111101001110101110100010011 |
| 1100001111:10000000010110001010001011101100 | 1100010000:00010110001100010011010010000101 |
| 1100010001:11101001110011101100101101111010 | 1100010010:01000011011001000110000111010000 |
| 1100010011:10111100100110111001111000101111 | 1100010100:01001010000000100000011110110110 |
| 1100010101:11011010111111011111100001001001 | 1100010110:011100000010101110101001011100011 |
| 1100010111:10001111101010001010110100011100 | 1100011000:00011001001111100011101110001010 |
| 1100011001:111001101100000011100010001110101 | 1100011010:01001100011010110110111011011111 |
| 1100011011:10110011100101001001000100100000 | 1100011100:0101010000011010000100010111001 |
| 1100011101:11010101111100101111011101000110 | 1100011110:01111111010110000101110111101100 |
| 1100011111:10000000101001111010001000010011 | 1100100000:00010110110011101100101110000101 |
| 1100100001:11101001001100010011010001111010 | 1100100010:01000011100110111001111011010000 |
| 1100100011:10111100011001000110000100101111 | |

TABLE 1e

| | |
|---|---|
| 1100100100:00100101111111011111100010110110 | 1100100101:11011010000000100000011101001001 |
| 1100100110:01110000101010001010110111100011 | 1100100111:10001111010101110101001000011100 |
| 1100101000:00011001110000011100010010001010 | 1100101001:11100110001111100011101101110101 |
| 1100101010:01001100100101001001000111011111 | 1100101011:10110011011010110110111000100000 |
| 1100101100:00101010111100101111011110111001 | 1100101101:11010101000011010000100001000110 |
| 1100101110:01111111101001111010001011101100 | 1100101111:10000000010110000101110100010011 |
| 1100110000:00111100011000111001101101111010 | 1100110001:11101001110011100011010010000101 |
| 1100110010:01000011011001001001111000101111 | 1100110011:10111100100110110110000111010000 |
| 1100110100:00100101000000101111100001001001 | 1100110101:11011010111111010000011110110110 |
| 1100110110:011100000010101111010110100011100 | 1100110111:10001111101010000101001011100011 |
| 1100111000:0001100100111101100010001110101 | 1100111001:11100110110000010011101110001010 |
| 1100111010:01001100011010111001000100100000 | 1100111011:10110011100101000110111011011111 |
| 1100111100:00101010000011011111011101000110 | 1100111101:11010101111100100000100010111001 |
| 1100111110:01111111010110001010001000010011 | 1100111111:10000000101001110101110111101100 |
| 1101000000:00111110101011011100010000001101 | 1101000001:11000001010100100011101111110010 |
| 1101000010:01101011111110001001000101011000 | 1101000011:10010100000001110110111010100111 |
| 1101000100:00001101100111101111011100111110 | 1101000101:11110010011000010000100011000001 |
| 1101000110:01011000110010111010001001101011 | 1101000111:10100111001101000101110110010100 |
| 1101001000:00110001101000101100101100000010 | 1101001001:11001110010111010011010011111101 |
| 1101001010:0110110011101111001111001010111 | 1101001011:1001101100010000110000110101000 |
| 1101001100:00000010100100011111100000110001 | 1101001101:11111101011011100000011111001110 |
| 1101001110:01010111110001001010110101100100 | 1101001111:10101000001110110101001010011011 |
| 1101010000:00111110010100101100010011110010 | 1101010001:11000001101011010011101100001101 |

TABLE 1e-continued

| | |
|---|---|
| 1101010010:01101011000001111001000110100111 | 1101010011:10010100111110000110111001011000 |
| 1101010100:00001101011000011111011111000001 | 1101010101:11110010100111100000100000111110 |
| 1101010110:01011000001101001010001010010100 | 1101010111:10100111110010110101110101101011 |
| 1101011000:00110001010111011100101111111101 | 1101011001:11001110101000100011010000000010 |
| 1101011010:01100100000010001001111010101000 | 1101011011:10011011111101110110000101010111 |
| 1101011100:00000010011011101111100011001110 | 1101011101:11111101100100010000011100110001 |
| 1101011110:01010111001110111010110110011011 | 1101011111:10101000110001000101001001100100 |
| 1101100000:00111110101011010011101111110010 | 1101100001:11000001010100101100010000001101 |
| 1101100010:01101011111110000110111010100111 | 1101100011:10010100000001111001000101011000 |
| 1101100100:00001101100111100000100011000001 | 1101100101:11110010011000011111011100111110 |
| 1101100110:01011000110010110101110110010100 | 1101100111:10100111001101001010001001101011 |
| 1101101000:00110001101000100011010011111101 | 1101101001:11001110010111011100101100000010 |
| 1101101010:01100100111101110110000110101000 | 1101101011:10011011000010001001111001010111 |
| 1101101100:00000010100100010000011111001110 | 1101101101:11111101011011101111100000110001 |
| 1101101110:01010111110001000101001010011011 | 1101101111:10101000001110111010110101100100 |
| 1101110000:00111110010100100011101100001101 | 1101110001:11000001101011011100010011110010 |
| 1101110010:01101011000001110110111001011000 | 1101110011:10010100111110001001000110100111 |
| 1101110100;00001101011000010000100000111110 | 1101110101:11110010100111101111011111000001 |
| 1101110110:01011000001101000101110101101011 | 1101110111:10100111110010111010001010010100 |
| 1101111000:00110001010111010011010000000010 | 1101111001:11001110101000101100101111111101 |
| 1101111010:01100100000010000110000101010111 | 1101111011:10011011111101111001111010101000 |
| 1101111100:00000010011011100000001110110001 | 1101111101:11111101100100011111110001001110 |
| 1101111110:01010111001110110101001001100100 | 1101111111:10101000110001001010110110011011 |
| 1110000000:00010111000000110101100110111101 | 1110000001:11101000111111001010011001000010 |
| 1110000010:01000010010101100000110011101000 | 1110000011:10111101101010011111001100010111 |
| 1110000100:00100100001100000110101010001110 | 1110000101:11011011110011111001010101110001 |
| 1110000110:01110001011001010011111111011011 | 1110000111:10001110100110101100000000100100 |
| 1110001000:00011000000011000101011010110010 | 1110001001:11100111111100111010100101001101 |
| 1110001010:01001101010110010000001111100111 | 1110001011:10110010101001101111110000011000 |
| 1110001100:00101011001111110110010110000001 | 1110001101:11010100110000001001101001111110 |
| 1110001110:01111110011010100011000011010100 | 1110001111:10000001100101011100111100101011 |
| 1110010000:0001011111111000101100101000010 | 1110010001:1110100000000111010011010111101 |
| 1110010010:01000010101010010000110000010111 | 1110010011:10111101010101101111001111101000 |
| 1110010100:00100100110011110110101001110001 | 1110010101:11011011001100001001010110001110 |
| 1110010110:01110001100110100011111100100100 | 1110010111:10001110011001011100000011011011 |
| 1110011000:00011000111100110101011001001101 | 1110011001:11100111000011001010100110110010 |
| 1110011010:01001101101001100000001100011000 | 1110011011:10110010010110011111110011100111 |
| 1110011100:00101011110000000110010101111110 | 1110011101:11010100001111111001101010000001 |
| 1110011110:01111110100101010011000000101011 | 1110011111:10000001011010101100111111010100 |
| 1110100000:00010111000000111010011001000010 | 1110100001:11101000111111000101100110111101 |
| 11101000010:10000100101011011110011000101111 | 1110100011:10111101101010010000110011101000 |
| 1110100100:00100100001100001001010101110001 | 1110100101:11011011110011110110101010001110 |
| 1110100110:01110001011001011100000000100100 | 1110100111:10001110100110100011111111011011 |
| 1110101000:00011000000011001010100101001101 | 1110101001:11100111111100110101011010110010 |
| 1110101010:01001101010110011111110000011000 | 1110101011:10110010101001100000001111100111 |
| 1110101100:00101011001111110011010011111110 | 1110101101:11010100110000001100101100000001 |
| 1110101110:01111110011010101100111100101011 | 1110101111:10000001100101010011000011010100 |
| 1110110000:00010111111110010100110101111101 | 1110110001:11101000000001101011001010000010 |
| 1110110010:01000010101010011111001111101000 | 1110110011:10111101010101100000110000010111 |
| 1110110100:00100100110011111001010110001110 | 1110110101:11011011001100001101010011100001 |
| 1110110110:01110001100110101100000011011011 | 1110110111:10001110011001010011111100100100 |
| 1110111000:00011000111100111010100110110010 | 1110111001:11100111000011000101011001001101 |
| 1110111010:01001101101001101111110011100111 | 1110111011:10110010010110010000001100011000 |
| 1110111100:00101011110000001001101010000001 | 1110111101:11010100001111110110010101111110 |
| 1110111110:01111110100101011100111111010100 | 1110111111:10000001011010100011000000101011 |
| 1111000000:00111111011000001010100111001010 | 1111000001:11000000100111110101011000110101 |
| 1111000010:01101010001101011111110010011111 | 1111000011:10010101110010100000001101100000 |
| 1111000100:00001100010100111001101011111001 | 1111000101:11110011101011000110010100000110 |
| 1111000110:01011001000001101100111110101100 | 1111000111:10100110111110010011000001010011 |
| 1111001000:00110000011011111010011011000101 | 1111001001:11001111100100000101100100111010 |
| 1111001010:01100101001110101111001110010000 | 1111001011:10011010110001010000110001101111 |
| 1111001100:00000011010111001001010111110110 | 1111001101:11111100101000110110101000001001 |
| 1111001110:01010110000010011100000010100011 | 1111001111:10101001111101100001111110101100 |
| 1111010000:00111111100111111010100100110101 | 1111010001:11000000011000000101011011001010 |
| 1111010010:01101010110010101111110001100000 | 1111010011:10010101001101010000001110011111 |
| 1111010100:00001100101011001001101000000110 | 1111010101:11110011010100110110010111111001 |
| 1111010110:01011001111110011100111101010011 | 1111010111:10100110000001100011000010101100 |
| 1111011000:00110000100100001010011000111010 | 1111011001:11001111011011110101100111000101 |
| 1111011010:01100101110001011111001101101111 | 1111011011:10011010001110100000110010010000 |
| 1111011100:00000011101000111001010100001001 | 1111011101:11111100010111000110101011110110 |
| 1111011110:0101011011110110110000000011100 | 1111011111:10101001000010010011111110100011 |
| 1111100000:00111111011000000101011000110101 | 1111100001:11000000100111111010100111001010 |
| 1111100010:01101010001101010000001101100000 | 1111100011:10010101110010101111110010011111 |
| 1111100100:00001100010100110110010100000110 | 1111100101:11110011101011001001101011111001 |
| 1111100110:01011001000001100011000001010011 | 1111100111:10100110111110011100111110101100 |
| 1111101000:00110000011011110101100100111010 | 1111101001:11001111100100001010011011000101 |
| 1111101010:01100101001110100000110001101111 | 1111101011:10011010110001011111001110010000 |
| 1111101100:00000011010111000110101000001001 | |

TABLE 1f

| |
|---|
| 1111101101:11111100101000111001010111110110 |
| 1111101110:01010110000010010011111101011100 |
| 1111101111:10101001111101101100000010100011 |
| 1111110000:00111111100111110101011011001010 |
| 1111110001:11000000011000001010100100110101 |
| 1111110010:01101010110010100000000111001111 |
| 1111110011:10010101001101011111110001100000 |
| 1111110100:00001100101011000110010111111001 |
| 1111110101:11110011010100111001101000000110 |
| 1111110110:01011001111110010011000010101100 |
| 1111110111:10100110000001101100111101010011 |
| 1111111000:00110000100100000101100111000101 |
| 1111111001:11001111011011111010011000111010 |
| 1111111010:01100101110001010000110010010000 |
| 1111111011:10011010001110101111001101101111 |
| 1111111100:00000011101000110110101011110110 |
| 1111111101:11111100010111001001010100001001 |
| 1111111110:01010110111101100011111110100011 |
| 1111111111:10101001000010011100000001011100 |

The decoding apparatus according to the embodiment of the present invention will be described referring to FIG. 9. An input signal r(t) is applied to 15 multipliers 902 to 906 and a correlation calculator 920. The input signal r(t) was encoded with a predetermined Walsh code and a predetermined mask sequence in a transmitter. A mask sequence generator 910 generates all possible 15 mask sequences M1 to M15. The multipliers 902 to 906 multiply the mask sequences received from the mask sequence generator 910 by the input signal r(t). The multiplier 902 multiplies the input signal r(t) by the mask sequence M1 received from the mask sequence generator 910. The multiplier 904 multiplies the input signal r(t) by the mask sequence M2 received from the mask sequence generator 910. The multiplier 906 multiplies the input signal r(t) by the mask sequence M15 received from the mask sequence generator 910. If the transmitter encoded TFCI bits with the predetermined mask sequence, one of the outputs of the multipliers 902 to 906 is free of the mask sequence, which means the mask sequence has no effect on the correlations calculated by one of the correlation calculators. For example, if the transmitter used the mask sequence M2 for encoding the TFCI bits, the output of the multiplier 904 that multiplies the mask sequence M2 by the input signal r(t) is free of the mask sequence. The mask sequence-free signal is TFCI bits encoded with the predetermined Walsh code. Correlation calculators 920 to 926 calculate the correlations of the input signal r(t) and the outputs of the multipliers 902 to 906 to 64 bi-orthogonal codes. The 64 bi-orthogonal codes have been defined before. The correlation calculator 920 calculates the correlation values of the input signal r(t) to the 64 bi-orthogonal codes of length 32, selects the maximum correlation value from the 64 correlations, and outputs the selected correlation value, a bi-orthogonal code index corresponding to the selected correlation value, and its unique index "0000" to a correlation comparator 940.

The correlation calculator 922 calculates the correlation values of the output of the multiplier 902 to the 64 bi-orthogonal codes, selects the maximum value of the 64 correlations, and outputs the selected correlation value, a bi-orthogonal code index corresponding to the selected correlation, and its unique index "0001" to the correlation comparator 940. The correlation calculator 924 calculates the correlation values of the output of the multiplier 904 to the 64 bi-orthogonal codes, selects the maximum of the 64 correlation values, and outputs the selected correlation value, a bi-orthogonal code index corresponding to the selected correlation value, and its unique index "0010" to the correlation comparator 940. Other correlation calculators (not shown) calculate the correlation values of the outputs of the correspondent multipliers to the 64 bi-orthogonal codes and operate similar to the above described correlation calculators, respectively.

Finally, the correlation calculator 926 calculates the correlation values of the output of the multiplier 906 to the 64 bi-orthogonal codes, selects the maximum value of the 64 correlations, and outputs the selected correlation value, a bi-orthogonal code index corresponding to the selected correlation value, and its unique index "1111" to the correlation comparator 940.

The unique indexes of the correlation calculators 920 to 926 are the same as the indexes of the mask sequences multiplied by the input signal r(t) in the multipliers 902 to 906. Table 2 lists the 15 mask indexes multiplied in the multipliers and a mask index assigned to the case that no mask sequence is used, by way of example.

TABLE 2

| mask sequence | mask sequence index | mask sequence | mask sequence index |
|---|---|---|---|
| not used | 0000 | M8 | 1000 |
| M1 | 0001 | M9 | 1001 |
| M2 | 0010 | M10 | 1010 |
| M3 | 0011 | M11 | 1011 |
| M4 | 0101 | M12 | 1100 |
| M5 | 0101 | M13 | 1101 |
| M6 | 0110 | M14 | 1110 |
| M7 | 0111 | M15 | 1111 |

As shown in Table 2, the correlation calculator 922, which receives the signal which is the product of the input signal r(t) and the mask sequence M1, outputs "0001" as its index. The correlation calculator 926, which receives the signal which is the product of the input signal r(t) and the mask sequence M15, outputs "1111" as its index. The correlation calculator 920, which receives only the input signal r(t), outputs "0000" as its index.

Meanwhile, the bi-orthogonal code indexes are expressed in a binary code. For example, if the correlation to $\overline{W4}$ which is the complement of W4 is the largest correlation value, a corresponding bi-orthogonal code index (a0 to a9) is "001001".

The correlation comparator 940 compares the 16 maximum correlation values received from the correlation calculators 920 to 926, selects the highest correlation value from the 16 received maximum correlation values, and outputs TFCI bits based on the bi-orthogonal code index and the mask sequence index(the unique index) received from the correlation calculator that corresponds to the highest correlation value. The TFCI bits can be determined by combining the bi-orthogonal code index and the mask sequence index. For example, if the mask sequence index is that of M4(0100) and the bi-orthogonal code index is that of $\overline{W4}$ (001001), the TFCI bits(a9 to a0) are "the M4 index (0100)+the $\overline{W4}$ index(001001)". That is, the TFCI bits(a9 to a0) are "0100001001"

Assuming that the transmitter transmitted code symbols corresponding to TFCI bits (a0 to a9) "1011000010", it can be said that the transmitter encoded the TFCI bits with $\overline{W6}$ and M4 according to the afore-described encoding procedure. The receiver can determine that the input signal r(t) is encoded with the mask sequence M4 by multiplying the input signal r(t) by all the mask sequences and that the input signal r(t) is encoded with $\overline{W6}$ by calculating the correlations of the input signal r(t) to all the bi-orthogonal codes.

Based on the above example, the fifth correlation calculator (not shown) will output the largest correlation value, the index of $\overline{W6}$ (101100) and its unique index(0010). Then, the receiver outputs the decoded TFCI bits(a0 to a9) "1011000010" by adding the index of $\overline{W6}$ "101100" and the M4 index "0010".

In the embodiment of the decoding apparatus, the input signal r(t) is processed in parallel according to the number of mask sequences. It can be further contemplated that the input signal r(t) is sequentially multiplied by the mask sequences and the correlations of the products are sequentially calculated in another embodiment of the decoding apparatus.

Figure 17:
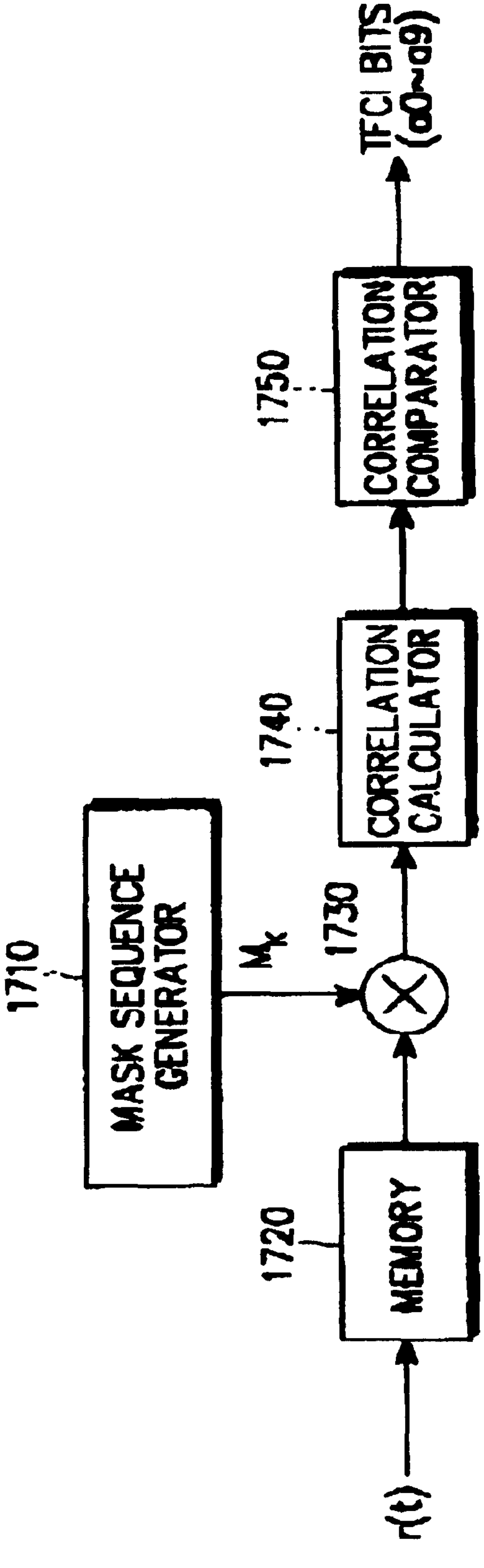
FIG. 17 is a block diagram of a third embodiment of the TFCI decoding apparatus in the IMT 2000 system according to the present invention.

FIG. 17 illustrates another embodiment of the decoding apparatus.

Referring to FIG. 17, a memory 1720 stores an input 32-symbol signal r(t). A mask sequence generator 1710 generates 16 mask sequences that were used in the transmitter and outputs them sequentially. A multiplier 1730 multiplies one of the 16 mask sequences received from the mask sequence generator 1710 by the input signal r(t) received from the memory 1720. A correlation calculator 1740 calculates the output of the multiplier 1730 to 64 biorthogonal codes bi-orthogonal of length 32 and outputs the maximum correlation value and the index of a biorthogonal code corresponding to the largest correlation value to a correlation comparator 1750. The correlation comparator 1750 stores the maximum correlation value and the biorthogonal code index received from the correlation calculator 1740, and the index of the mask sequence received from the mask sequence generator 1710.

Upon completion of above processing with the mask sequence, the memory 1720 outputs the stored input signal r(t) to the multiplier 1730. The multiplier 1730 multiplies the input signal r(t) by one of the other mask sequences. The correlation calculator 1740 calculates correlation of the output of the multiplier 1730 to the 64 biorthogonal codes of length 32 and outputs the maximum correlation value and the index of a biorthogonal code corresponding to the maximum correlation value. The correlation comparator 1750 stores the maximum correlation value, the biorthogonal code index corresponding to the maximum correlation value, and the mask sequence index received from the mask sequence generator 1710.

The above procedure is performed on all of the 16 mask sequences generated from the mask sequence generator 1710. Then, 16 maximum correlation values the indexes of biorthogonal codes corresponding to the maximum correlation value are stored in the correlation comparator 1750. The correlation comparator 1750 compares the stored 16 correlation values and selects the one with the highest correlation and outputs TFCI bits by combining the indexes of the biorthogonal code and mask sequence index corresponding to the selected maximum correlation value. When the decoding of the TFCI bits is completed, the input signal r(t) is deleted from the memory 1720 and the next input signal r(t+1) is stored.

While the correlation comparator 1750 compares the 16 maximum correlation values at one time in the decoding apparatus of FIG. 17, real-time correlation value comparison can be contemplated. That is, the first input maximum correlation value is compared with the next input maximum correlation value and the larger of the two correlation values and a mask sequence index and a biorthogonal code index corresponding to the correlation are stored. Then, the thirdly input maximum correlation is compared with the stored correlation and the larger of the two correlations and a mask sequence index and a biorthogonal code index corresponding to the selected correlation are stored. This comparison operation occurs 15 times which is the number of mask sequences generated from the mask sequence generator 1710. Upon completion of all the operations, the correlation comparator 1710 output the finally stored biorthogonal index(a0 to a6) and mask sequence index(a7 to a9) and outputs the added bits as TFCI bits.

Figure 10:
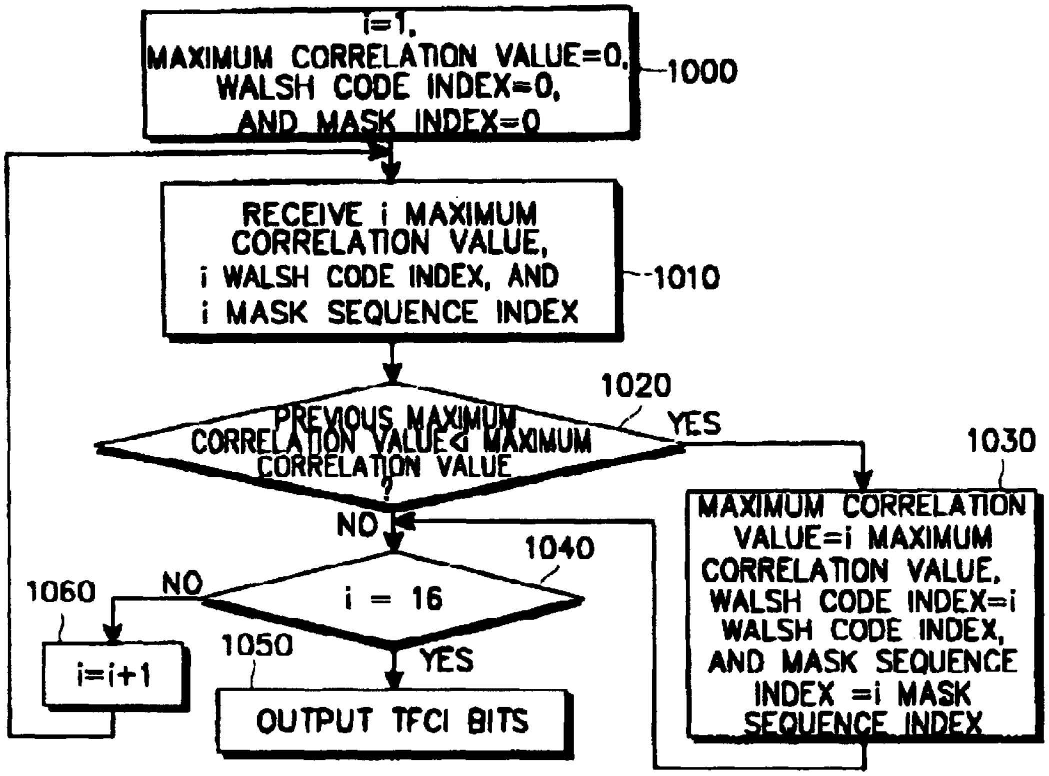
FIG. 10 is a flowchart illustrating a control operation of a correlation comparator shown in FIG. 9.

FIG. 10 is a flowchart illustrating the operation of the correlation comparator 940 shown in FIG. 9. The correlation comparator 940 stores the sixteen maximum correlation values, selects a highest correlation value out of the 16 maximum correlation values and output TFCI bits based on the indexes of a bi-orthogonal code and a mask sequence corresponding to the selected highest correlation value. The sixteen correlation values are compared, and TFCI bits are outputted based on the indexes of a bi-orthogonal code and a mask sequence corresponding to the highest correlation value.

Referring to FIG. 10, a maximum correlation index i is set to 1 and the indices of a maximum correlation value, a biorthogonal code, and a mask sequence to be checked are set to 0s in step 1000. In step 1010, the correlation comparator 940 receives a $1^{st}$ maximum correlation value, a $1^{st}$ bi-orthogonal code index, and a $1^{st}$ mask sequence index from the correlation calculator 920. The correlation comparator 940 compares the $1^{st}$ maximum correlation with an the previous maximum correlation value in step 1020. If the $1^{st}$ maximum correlation is greater than the previous maximum correlation, the procedure goes to step 1030. If the $1^{st}$ maximum correlation is equal to or smaller than the previous maximum correlation, the procedure goes to step 1040. In step 1030, the correlation comparator 940 designates the $1^{st}$ maximum correlation as a final maximum correlation and stores the $1^{st}$ bi-orthogonal code and mask sequence indexes as final bi-orthogonal code and mask sequence indexes. In step 1040, the correlation comparator 940 compares the index i with the number 16 of the correlation calculators to determine whether all 16 maximum correlations are completely compared. If i is not 16, the index i is increased by 1 in step 1060 and the procedure returns to step 1010. Then, the above procedure is repeated.

In step 1050, the correlation comparator 940 outputs the indexes of the bi-orthogonal code and the mask sequence that correspond to the final maximum correlation as decoded bits. The bi-orthogonal code index and the mask sequence index corresponding to the decoded bits are those corresponding to the final maximum correlation among the 16 maximum correlation values received from the 16 correlation calculators.

3. Second Embodiment of Encoding/Decoding Apparatus and Method

The (32, 10) TFCI encoder that outputs a 32-symbol TFCI codeword in view of 16 slots has been described in the first embodiment of the present invention. Recently, the IMT-2000 standard specification dictates having 15 slots in one frame. Therefore, the second embodiment of the present invention is directed to a (30, 10) TFCI encoder that outputs a 30-symbol TFCI codeword in view of 15 slots. Therefore, the second embodiment of the present invention suggests an encoding apparatus and method for outputting 30 code symbols by puncturing two symbols of 32 coded symbols (codeword) as generated from the (32, 10) TFCI encoder.

The encoding apparatuses according to the first and second embodiments of the present invention are the same in configuration except that sequences output from a one-bit generator, a basis Walsh code generator, and a basis mask sequence generator. The encoder apparatus outputs coded symbols of length 30 with symbol #0(1$^{st}$ symbol) and symbol #16(17$^{th}$ symbol) are punctured in the encoding apparatus of the second embodiment.

Referring to FIG. 8, 10 input information bits a0 to a9 are applied to the input of the 840 to 849. The one-bit generator 800 outputs symbols 1s(length 32) to the multiplier 840. The multiplier 840 multiplies the input information bit a0 by each 32 symbol received from the one-bit generator 800. The basis Walsh code generator 810 simultaneously generates basis Walsh codes W1, W2, W4, W8, and W16 of length 32. The multiplier 841 multiplies the input information bit a1 by the basis Walsh code W1 "01010101010101010101010101010101". The multiplier 842 multiplies the input information bit a2 by the basis Walsh code W2 "00110011001100110011001100110011". The multiplier 843 multiplies the input information bit a3 by the basis Walsh code W4 "00001111000011110000111100001111" The multiplier 844 multiplies the input information bit a4 by the basis Walsh code W8 "00000000111111110000000011111111". The multiplier 845 multiplies the input information bit a5 by the basis Walsh code W16 "00000000000000001111111111111111".

The basis mask sequence generator 820 simultaneously generates basis mask sequences M1, M2, M4, and M8 of length 32. The multiplier 846 multiplies the input information bit a6 by the basis mask sequence M1 "00101000011000111111000001110111". The multiplier 847 multiplies the input information bit a7 by the basis mask sequence M2 "00000001110011010110110111000111". The multiplier 848 multiplies the input information bit a8 by the basis mask sequence M4 "00001010111110010001101100101011". The multiplier 849 multiplies the input information bit a9 by the basis mask sequence M8 "00011100001101110010111101010001". The multipliers 840 to 849 function like switches that control the output of or the generation of the bits from the one-bit generator, each of the basis Walsh codes and each of the basis mask sequences.

The adder 860 sums the outputs of the multipliers 840 to 849 symbol by symbol and outputs 32 coded symbols (i.e., a TFCI codeword). Out of the 32 coded symbols, two symbols will be punctured at predetermined positions (i.e. the symbol #0(the first symbol) and symbol #16(the 17$^{th}$ symbol) of the adder 860 output are punctured). The remaining 30 symbols will become the 30 TFCI symbols. It will be easy to modify the second embodiment of present invention. For example, the one-bit generator 800, basis Walsh generator 810, basis mask sequence generator 820 can generate 30 symbols which excludes the #0 and #16 symbols. The adder 860 then adds the output of the one-bit generator 800, basis Walsh generator 810 and basis mask sequence generator 820 bit by bit and output 30 encoded symbols as TFCI symbols.

Figure 12:
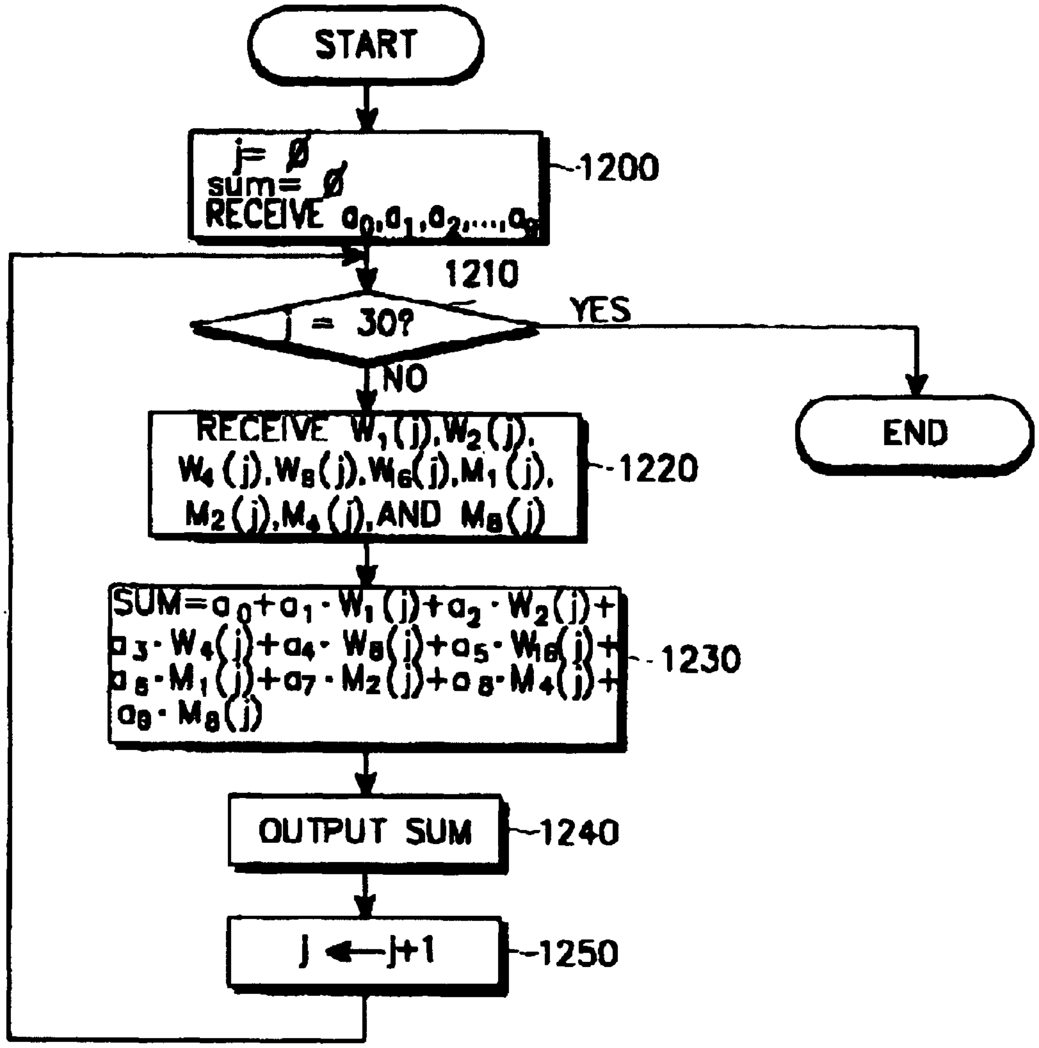
FIG. 12 is a flowchart illustrating another embodiment of the TFCI encoding procedure in the IMT 2000 system according to the present invention.

FIG. 12 is a encoding method for the second embodiment of present invention. The flowchart illustrating the steps of the encoding apparatus according to the second embodiment of the present invention when the number of slots is 15.

Referring to FIG. 12, 10 input information bits a0 to a9 are received and variables sum and j are set to an initial value 0 in step 1200. In step 1210, it is determined whether j is 30. If j is not 30 in step 1210, the jet symbols W1(j), W2(j), W4(j), W8(j), and W16(j) of the basis Walsh codes W1, W2, W4, W8, and W16 (each having two punctured bits) and the j$^{th}$ symbols M1(j), M2(j), M4(j), and M8(j) of the basis mask sequences M1, M2, M4, and M8 (each having two punctured bits) are received in step 1220. Then, the received symbols are multiplied by the input information bits on a symbol basis and the multiplied symbols are summed in step 1230. In step 1240, sum indicating the achieved j$^{th}$ code symbol is output. j is increased by 1 in step 1250 and then the procedure returns to step 1210. Meanwhile, if j is 30 in step 1210, the encoding procedure ends.

The (30, 10) encoder outputs 1024 codewords equivalent to the codewords of the (32, 10) encoder with symbols #0 and #16 punctured. Therefore, the total number of information can be expressed is 1024.

The output of a (30, 9) encoder is combinations of 32 Walsh codes of length 30 obtained by puncturing symbols #0 and #16 of each of 32 Walsh codes of length 32, 32 bi-orthogonal codes obtained by adding 1 to each symbol of the punctured Walsh codes (by multiplying −1 to each symbol in the case of a real number), and 8 mask sequences obtained by combining any three of the four punctured basis mask sequences.

The output of a (30, 8) encoder is combinations of 32 Walsh codes of length 30 obtained by puncturing #0 and #16 symbols from each of 32 Walsh codes having a length 32 symbols, 32 bi-orthogonal codes obtained by adding 1 to each symbol of the punctured Walsh codes (by multiplying −1 to each symbol in the case of a real number), and 4 mask sequences obtained by combining any two of the four punctured basis mask sequences.

The output of a (30, 7) encoder is combinations of 32 Walsh codes of length 30 obtained by puncturing #0 and #16 symbols from each of 32 Walsh codes having a length 32 symbols, 32 bi-orthogonal codes obtained by adding 1 to each symbol of the punctured Walsh codes (by multiplying −1 to each symbol in the case of a real number), and one of the four punctured basis mask sequences.

All the above encoders for providing an extended TFCI have a minimum distance of 10.

The (30, 9), (30, 8), and (30, 7) encoders can be implemented by blocking input and output of at least one of the four basis mask sequences generated from the basis mask sequence generator 820 shown in FIG. 8.

The above encoders flexibly encode TFCI bits according to the number of the TFCI bits and has a maximized minimum distance that determines encoding performance.

A decoding apparatus according to the second embodiment of the present invention is the same in configuration and operation as the decoding apparatus of the first embodiment except for different signal lengths of the encoded symbols. That is, after (32, 10) encoding, two symbols out of the 32 encoded symbols are punctured, or basis Walsh codes with two punctured symbols and basis mask sequences with two punctured symbols are used for generating the 30 encoded symbols. Therefore, except for the received signal r(t) which includes a signal of 30 encoded symbols and insertion of dummy signals at the punctured positions, all decoding operations are equal to the description of the first embodiment of present invention.

As FIG. 17, this second embodiment of decoding also can be implemented by a single multiplier for multiplying the masks with r(t) and a single correlation calculator for calculating correlation values of bi-orthogonal codes.

4. Third Embodiment of Encoding/Decoding Apparatus and Method

The third embodiment of the present invention provides an encoding apparatus for blocking the output of a one-bit generator in the (30, 7), (30, 8), (30, 9) or (30, 10) (hereinafter we express (30, 7–10))encoder of the second embodiment and generating another mask sequence instead in order to set a minimum distance to 11. The encoders refer to an encoder that outputs a 30-symbol TFCI codeword for the input of 7, 8, 9 or 10 TFCI bits.

Figure 14:
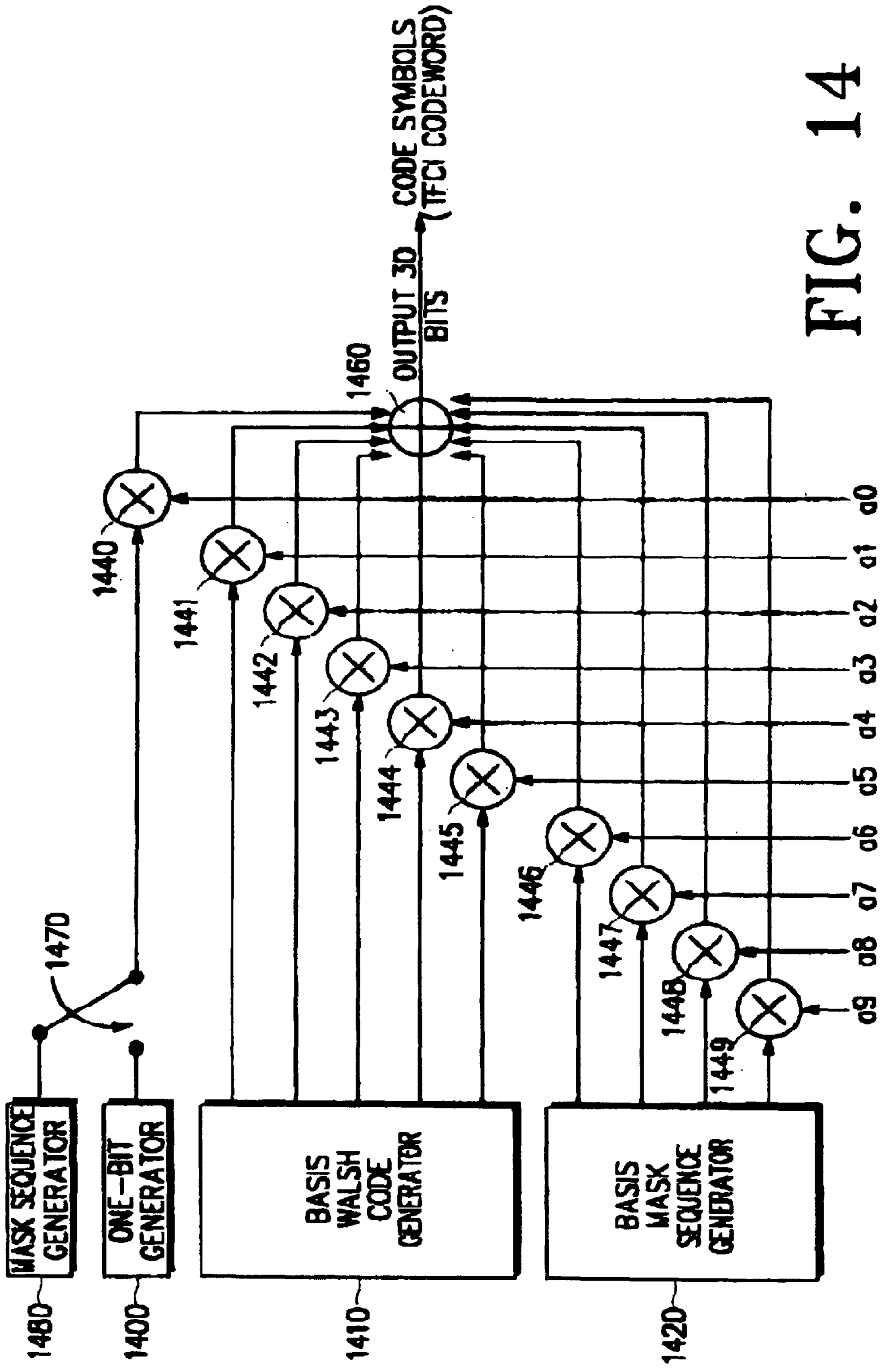
FIG. 14 is a block diagram of another embodiment of the TFCI encoding apparatus in the IMT 2000 system according to the present invention.

FIG. 14 is a block diagram of a third embodiment of the encoding apparatus for encoding a TFCI in the IMT 2000 system. In the drawing, a (30, 7–10) encoder is configured to have a minimum distance of 11.

The encoding apparatus of the third embodiment is similar in structure to that of the second embodiment except that a mask sequence generator 1480 for generating a basis mask sequence M16 and a switch 1470 for switching the mask sequence generator 1480 and a one-bit generator 1400 to a multiplier 1440 are further provided to the encoding apparatus according to the third embodiment of the present invention.

The two bit punctured basis mask sequences M1, M2, M4, M8, and M16 as used in FIG. 14 are

M1=000001011111000010110100111110

M2=000110001100110001111010110111

M4=010111100111101010000001100111

M8=011011001000001111011100001111

M16=100100011110011111000101010011

Referring to FIG. 14, when a (30, 6) encoder is used, the switch 1470 switches the one-bit generator 1400 to the multiplier 1440 and blocks all the basis mask sequences generated from a basis mask sequence generator 1480. The multiplier 1440 multiplies the symbols from the one-bit generator 1400 with the input information bit a0, symbol by symbol.

If a (30, 7–10) encoder is used, the switch 1470 switches the mask sequence generator 1480 to the multiplier 1440 and selectively uses four basis mask sequences generated from a basis mask sequence generator 1420. In this case, 31 mask sequences M1 to M31 can be generated by combining 5 basis mask sequences.

The structure and operation of outputting code symbols for the input information bits a0 to a9 using multipliers 1440 to 1449 are the same as the first and second embodiments. Therefore, their description will be omitted.

As stated above, the switch 1470 switches the mask sequence generator 1480 to the multiplier 1440 to use the (30, 7–10) encoder, whereas the switch 1470 switches the one-bit generator 1400 to the multiplier 1440 to use the (30, 6) encoder.

For the input of 6 information bits, the (30, 6) encoder outputs a 30-symbol codeword by combining 32 Walsh codes of length 30 with 32 bi-orthogonal codes obtained by inverting the Walsh codes by the use of the one-bit generator 1400.

For the input of 10 information bits, the (30, 10) encoder outputs a 30-symbol codeword by combining 32 Walsh codes of length 30 and 32 mask sequences generated using five basis mask sequences. Here, the five basis mask sequences are M1, M2, M4, M8, and M16, as stated above and the basis mask sequence M16 is output from the mask sequence generator 1480 that is added for the encoding apparatus according to the third embodiment of the present invention. Hence, 1024 codewords can be achieved from the (30, 10) encoder. The (30, 9) encoder outputs a 30-symbol codeword by combining 32 Walsh codes and 16 mask sequences, for the input of 9 information bits. The 16 mask sequences are achieved by combining four of five basis mask sequences. The (30, 8) encoder outputs a 30-symbol codeword by combining 32 Walsh codes and 8 mask sequences, for the input of 8 information bits. The 8 mask sequences are obtained by combining three of five basis mask sequences. For the input of 7 information bits, the (30, 7) encoder outputs a 30-symbol codeword by combining 32 Walsh codes of length 30 and four mask sequences. The four mask sequences are obtained by combining two of five basis mask sequences.

All the above (30, 7–10) encoders have a minimum distance of 11 to provide extended TFCIs. The (32, 7–10) encoders can be implemented by controlling use of at least one of the five basis mask sequences generated from the basis mask sequence generator 1420 and the mask sequence generator 1480 shown in FIG. 14.

Figure 16:
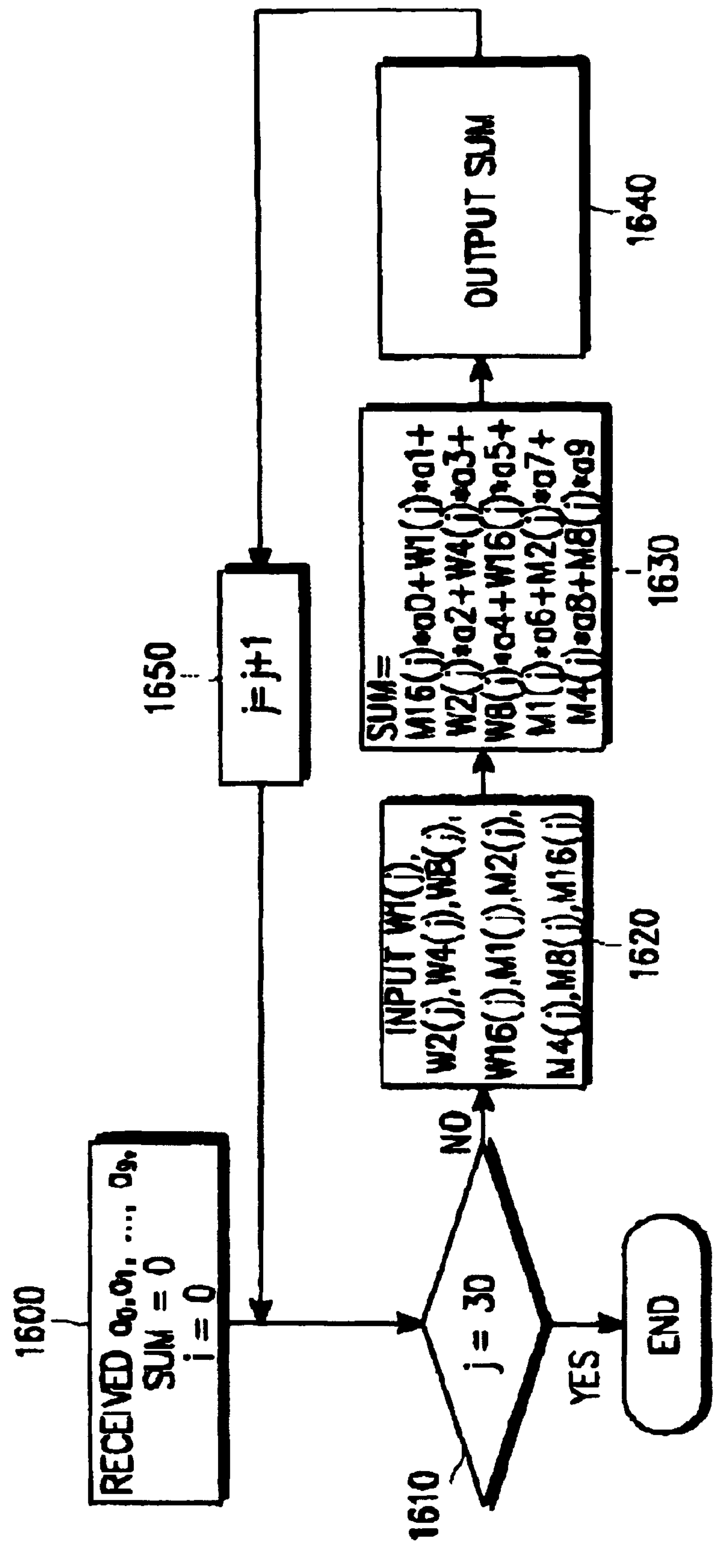
FIG. 16 is a flowchart illustrating another embodiment of the TFCI encoding procedure in the IMT 2000 system according to the present invention.

FIG. 16 is a flowchart illustrating a third embodiment of the TFCI encoding procedure in the IMT 2000 system according to the present invention.

Referring to FIG. 16, 10 information bits (TFCI bits) a0 to a9 are received and variables sum and j are set to initial values 0s in step 1600. The variable sum indicates a final code symbol output after symbol-basis addition and the variable j indicates the count number of final code symbols output after the symbol-basis addition. It is determined whether j is 30 in step 1610 in view of the length 30 of punctured Walsh codes and mask sequences used for encoding. The purpose of performing step 1610 is to judge whether the input information bits are encoded with respect to the 30 symbols of each Walsh code and the 30 symbols of each mask sequence.

If j is not 30 in step 1610, which implies that encoding is not completed with respect to all the symbols of the Walsh codes and mask sequences, the $j^{th}$ symbols W1($j$), W2($j$), W4($j$), W8($j$), and W16($j$) of the basis Walsh codes W1, W2, W4, W8, and W16 and the $j^{th}$ symbols M1($j$), M2($j$), M4($j$), M8($j$), and M16($j$) of the basis mask sequences M1, M2, M4, M8, and M16 are received in step 1620. In step 1630, the input information bits are multiplied by the received symbols symbol by symbol and the symbol products are summed.

Step 1630 can be expressed as $$\text{sum}=a0\cdot M16(j)+a1\cdot W1(j)+a2\cdot W2(j)+a3\cdot W4(j)+a4\cdot W8(j)+a5\cdot W16(j)+a6\cdot M1(j)+a7\cdot M2(j)+a8\cdot M4(j)+a9\cdot M8(j) \quad \text{(Eq. 10)}$$

As noted from Eq. 10, an intended code symbol is obtained by multiplying each input information bit by the symbols of a corresponding basis Walsh code or basis mask sequence and summing the products.

In step 1640, sum indicating the achieved $j^{th}$ code symbol is output. j is increased by 1 in step 1650 and then the procedure returns to step 1610. Meanwhile, if j is 30 in step 1610, the encoding procedure ends.

Figure 15:
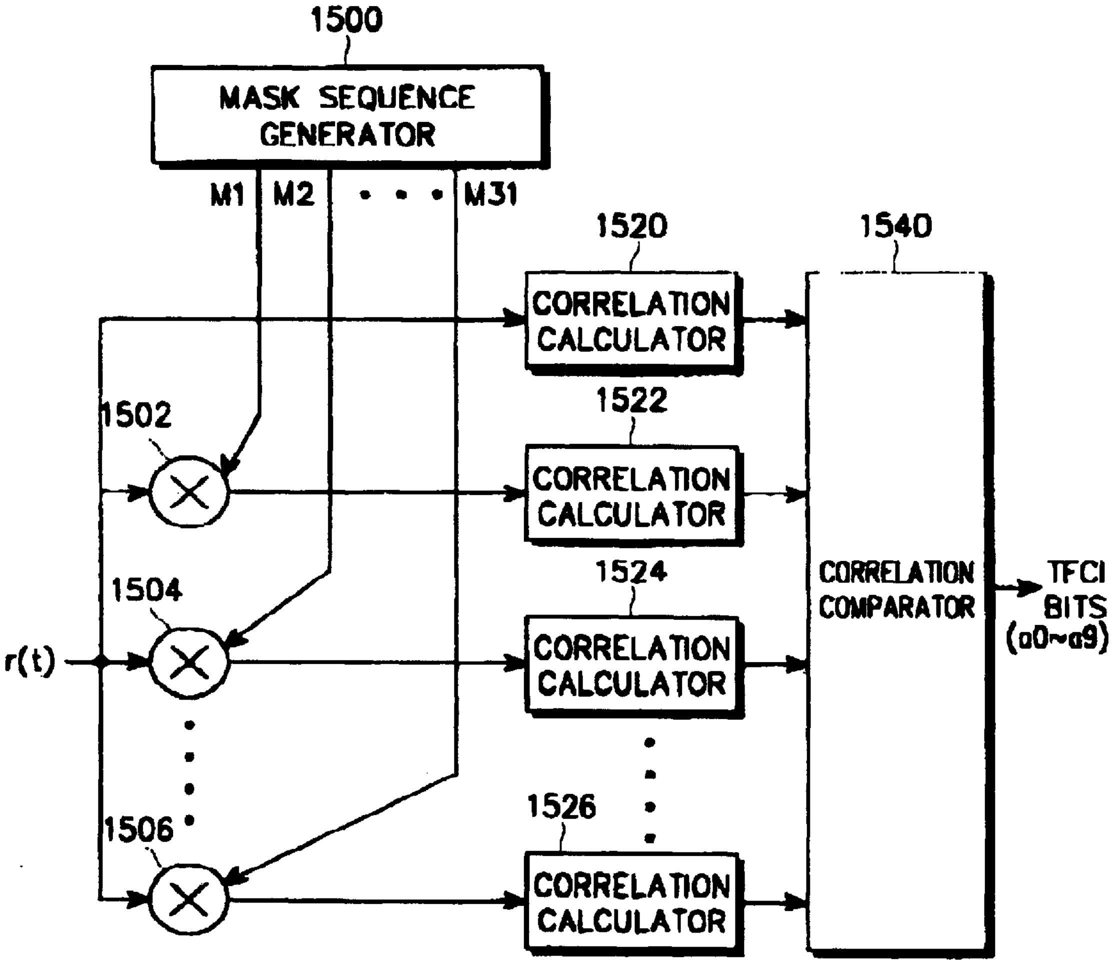
FIG. 15 is a block diagram of another embodiment of the TFCI decoding apparatus in the IMT 2000 system according to the present invention.

Now there will be given a description of the third embodiment of the decoding apparatus referring to FIG. 15. An input signal r(t) which includes the 30 encoded symbols signal transmitted by a transmitter and two dummy symbols which have been inserted at the positions that have been punctured by the encoder is applied to 31 multipliers 1502 to 1506 and a correlation calculator 1520. A mask sequence generator 1500 generates all possible 31 mask sequences of length 32 M1 to M31. The multipliers 1502 to 1506 multiply the mask sequences received from the mask sequence generator 1500 by the input signal r(t). If a transmitter encoded TFCI bits with a predetermined mask sequence, one of the outputs of the multipliers 1502 to 1506 is free of the mask sequence, which means the mask sequence has no effect on the following correlation calculator. For example, if the transmitter used the mask sequence M31 for encoding the TFCI bits, the output of the multiplier 1506 that multiplies the mask sequence M31 by the input signal r(t) is free of the mask sequence. However, if the transmitter did not use a mask sequence, the input signal r(t) itself applied to a correlation calculator 1520 is a mask sequence-free signal. Each correlation calculators 1520 to 1526 calculates the correlation values of the outputs of the multipliers 1502 to 1506 with 64 bi-orthogonal codes of length 32, determines maximum correlation value among the 64-correlation sets, and outputs the determined maximum correlation values, the indexes of each bi-orthogonal codes corresponding to the determined maximum correlation values, and each index of the mask sequences to a correlation comparator 1540, respectively.

The correlation comparator 1540 compares the 32 maximum correlation values received a from the correlation calculators 1520 to 1526 and determines the largest of the maximum correlation values as a final maximum correlation. Then, the correlation comparator 1540 outputs the decoded TFCI bits transmitted by the transmitter on the basis of the indexes of the bi-orthogonal code and mask sequence corresponding to the final maximum correlation value. As in FIG. 17, the third embodiment of present invention can be also implemented by a single multiplier for multiplying the masks with r(t) and a single correlation calculator for calculating correlation values of bi-orthogonal codes.

As described above, the present invention provides an apparatus and method for encoding and decoding a basic TFCI and an extended TFCI variably so that hardware is simplified. Another advantage is that support of both basic TFCI and extended TFCI error correcting coding schemes increases service stability. Furthermore, a minimum distance, a factor that determined the performance of an encoding apparatus, is large enough to satisfy the requirement of an IMT 2000 system, thereby ensuing excellent performance.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A transport format combination indicator (TFCI) encoding apparatus in a CDMA mobile communication system, comprising:

- a one-bit generator for generating a sequence having the same symbols;
- a basis orthogonal sequence generator for generating a plurality of basis orthogonal sequences;
- a basis mask sequence generator for generating a plurality of basis mask sequences; and
- an operation unit for receiving TFCI bits that are divided into a first information part representing biorthogonal sequence conversion, a second information part representing orthogonal sequence conversion, and a third information part representing mask sequence conversion and adding an orthogonal sequence selected from the basis orthogonal sequence based on the second information part and a mask sequence selected based on the third information part.

2. The TFCI encoding apparatus of claim 1, wherein the same symbols are 1s.

3. The TFCI encoding apparatus of claim 1, wherein the plurality of basis orthogonal sequences are a first Walsh code, a second Walsh code, a fourth Walsh code, an eighth Walsh code, and a sixteenth Walsh code.

4. The TFCI encoding apparatus of claim 1, wherein the basis mask sequences includes a first mask sequence "00101000011000111111000001110111", a second mask sequence "00000001110011010110110111000111", a fourth mask sequence "00001010111110010001101100101011", and an eighth mask sequence "00011100001101110010111101010001".

5. The TFCI encoding apparatus of claim 1, wherein the operation unit further comprises a converter for providing bi-orthogonal sequences by complementing the orthogonal sequences.

6. The TFCI encoding apparatus of claim 5, wherein the converter is an adder for adding a '1' to the symbols in each of the orthogonal sequences.

7. The TFCI encoding apparatus of claim 1, wherein the basis mask sequence length is 32 symbols.

8. The TFCI encoding apparatus of claim 1, wherein the basis mask sequence generator has a first m-sequence and a second m-sequence which can be added together to form a Gold code, forms a first sequence group having sequences formed by cyclically shifting the first m-sequence and a second sequence group having sequences formed by cyclically shifting the second m-sequence, generates a column transposition function to convert the sequences in the first group into the orthogonal sequences, inserts a column of '0' in the front of the sequences in the second group, and generates and applies a reverse column transposition function to the sequences in the second group to convert the sequences in the second group into the mask sequences.

9. The TFCI encoding apparatus of claim 8, wherein the basis mask sequences are a first mask sequence "00101000011000111111000001110111", a second mask sequence "000000011100110101101010111000111", a fourth mask sequence "00001010111110010001101100101011", and an eighth mask sequence "00011100001101110010111101010001".

10. The TFCI encoding apparatus of claim 1, wherein the operation unit comprises:

- a first multiplier for multiplying the same symbols by the first information part;
- a plurality of second multipliers for multiplying the basis orthogonal sequences by the respective TFCI bits representing the second information part;
- a plurality of third multipliers for multiplying the basis mask sequences by the respective TFCI bits representing the third information part; and
- an adder for adding the outputs of the first, second, and third multipliers.

11. A TFCI encoding apparatus in a CDMA mobile communication system, comprising:

- a one-bit generator for generating a sequence having the same symbols;
- an orthogonal sequence generator for generating a plurality of basis orthogonal sequences;
- a mask sequence generator for generating a plurality of basis mask sequences;
- a plurality of multipliers as many as input TFCI bits, for multiplying the same symbols by corresponding TFCI bits, the plurality of basis orthogonal sequences by corresponding TFCI bits, and the plurality of basis mask sequences by corresponding TFCI bits; and
- an adder for summing sequences received from the plurality of multipliers.

12. The TFCI encoding apparatus of claim 11, wherein the mask sequence generator has a first m-sequence and a second m-sequence which can be added together to form a Gold code, forms a first sequence group having sequences formed by cyclically shifting the first m-sequence and a second sequence group having sequences formed by cyclically shifting the second m-sequence, generates and applies a column transposition function to the sequences in the first group to convert the sequences in the first group to the orthogonal sequences, inserts a column of '0' in the front of the sequences in the second group, and generates and applies a reverse column transposition function to the sequences in the second group to convert the sequences in the second group to the mask sequences.

13. The TFCI encoding apparatus of claim 11, wherein the basis mask sequences are a first mask sequence "00101000011000111111000001110111", a second mask sequence "00000001110011010110110111000111", a fourth mask sequence "00001010111110010001101100101011", and an eighth mask sequence "00011100001101110010111101010001".

14. A TFCI encoding method in a CDMA mobile communication system, comprising the steps of:

generating the same symbols;

generating a plurality of basis orthogonal sequences;

generating a plurality of basis mask sequences; and receiving TFCI bits that are divided into a first information part representing biorthogonal sequence conversion, a second information part representing orthogonal sequence conversion, and a third information part representing mask sequence conversion and combining an orthogonal sequence selected from the basis orthogonal sequence based on the second information part, a biorthogonal sequence obtained by combining the selected orthogonal sequence with the same symbols selected based on the first information part, and a mask sequence selected based on the biorthogonal sequence and the third information part.

15. The TFCI encoding method of claim 14, wherein the same symbols are 1s.

16. The TFCI encoding method of claim 14, wherein the plurality of basis orthogonal sequences are a first Walsh code, a second Walsh code, a fourth Walsh code, an eighth Walsh code, and a sixteenth Walsh code.

17. The TFCI encoding apparatus of claim 14, wherein the mask sequence generator has a first m-sequence and a second m-sequence which can be added together to form a Gold code, forms a first sequence group having sequences formed by cyclically shifting the first m-sequence and a second sequence group having sequences formed by cyclically shifting the second m-sequence, generates and applies a column transposition function to the sequences in the first group to convert the sequences in the first group to the orthogonal sequences, inserts a column of '0' in the front of the sequences in the second group, and generates and applies a reverse column transposition function to the sequences in the second group to convert the sequences in the second group to the mask sequences.

18. The TFCI encoding method of claim 14, wherein the basis mask sequences are a first mask sequence "00101000011000111111000001110111", a second mask sequence "00000001110011010110110111000111", a fourth mask sequence "00001010111110010001101100101011", and an eighth mask sequence "00011100001101110010111101010001".

19. The TFCI encoding method of claim 14, wherein the same symbols are multiplied by the first information part, the basis orthogonal sequences are multiplied by the respective TFCI bits representing the second information part, the basis mask sequences are multiplied by the respective TFCI bits representing the third information part, and the multiplication results are summed.

20. A TFCI decoding apparatus in a CDMA mobile communication system, comprising;

a mask sequence generator for sequentially generating a plurality of mask sequences;

an operation circuit for receiving an input signal and the mask sequences from the mask sequence generator, and removing a mask sequence from the input signal by multiplying the mask sequences by the input signal;

a correlator for receiving signals from the operation circuit sequentially, calculating correlation value of each received signal with a plurality of orthogonal sequences having corresponding indexes, and sequentially selecting the largest correlation values and an orthogonal sequence index corresponding to the largest correlation value; and a correlation comparator for determining the highest correlation value out of the sequentially selected largest correlation values, from the correlator and outputting an orthogonal sequence index and a mask sequence index corresponding to the determined highest correlation value.

21. The TFCI encoding apparatus of claim 20, wherein the mask sequence generator has a first m-sequence and a second m-sequence which can be added together to form a Gold code, forms a first sequence group having sequences formed by cyclically shifting the first m-sequence and a second sequence group having sequences formed by cyclically shifting the second m-sequence, generates and applies a column transposition function to the sequences in the first group to convert the sequences in the first group to orthogonal sequences, inserts a column of '0' in the front of the sequences in the second group, and generates and applies a reverse column transposition function to the sequences in the second group to convert the sequences in the second group to the mask sequences.

22. The TFCI decoding apparatus of claim 20, further comprising a memory for storing the input signal and outputting the input signal to the operation circuit until the input signal is completely multiplied by the mask sequences generated from the mask sequence generator.

23. The TFCI decoding apparatus of claim 22, wherein the operation circuit is a multiplier.

24. The TFCI decoding apparatus of claim 20, wherein the mask sequence index is the index of the mask sequence used to remove a mask sequence from the input signal.

25. A TFCI decoding apparatus in a CDMA mobile communication system, comprising;

a mask sequence generator for sequentially generating a plurality of mask sequences;

a plurality of operation circuits for receiving an input signal and the mask sequences from the mask sequence generator and multiplying the mask sequences by the input signal;

a first correlator for calculating correlation values of the received signal with a plurality of orthogonal sequences, selecting the largest correlation value and an orthogonal sequence index corresponding to the largest correlation value;

a plurality of secondary correlators for receiving the input signal and the outputs of the operation circuits, calculating correlation values of the received signals with a plurality of orthogonal sequences having corresponding indexes, and selecting the largest correlation value and orthogonal sequences index corresponding to the largest correlation value, respectably; and a correlation comparator for determining the highest correlation value from the selected largest correlation values received from the correlators and outputting TFCI information based on an orthogonal sequence index and a mask sequence index corresponding to the determined highest correlation value.

26. The TFCI encoding apparatus of claim 25, wherein the mask sequence generator has a first m-sequence and a second m-sequence which can be added together to form a Gold code, forms a first sequence group having sequences formed by cyclically shifting the first m-sequence and a second sequence group having sequences formed by cyclically shifting the second m-sequence, generates and applies a column transposition function to the sequences in the first group to convert the sequences in the first group to orthogonal sequences, inserts a column of '0' in the front of the sequences in the second group, and generates and applies a reverse column transposition function to the sequences in the second group to convert the sequences in the second group to the mask sequences.

27. The TFCI decoding apparatus of claim 26, wherein the operation circuits are multipliers.

28. The TFCI decoding apparatus of claim 25, wherein the mask sequence index is the index of the mask sequence used to remove a mask sequence from the input signal corresponding to the determined correlation value.

29. A mask sequence generating method for use in a TFCI encoding and decoding, comprising the steps of:

selecting a Gold sequence which is determined by adding a first m-sequence and a second m-sequence, each of the m-sequences generated by different generation polynomials;

generating a first m-sequence group by cyclically shifting the first m-sequence where the first m-sequence is shifted one to 'n' times, 'n' is a length of the first and second m-sequences and each shift of the first m-sequence produces a sequence forming the first m-sequence group;

generating a second m-sequence group by cyclically shifting the second m-sequence where the second m-sequence is shifted one to 'n' times and each shift of the second m-sequence produces a sequence forming the second m-sequence group;

determining a column transposition function that converts sequences in the first m-sequence group to orthogonal sequences;

inserting a column of '0' in the front of the sequences in the second m-sequence group;

column changing the second m-sequence group by applying the reverse function of the sequence transposition function to generate mask sequences of the TFCI coding/decoding.

* * * * *